(12) United States Patent
Ariga et al.

(10) Patent No.: US 8,420,499 B2
(45) Date of Patent: Apr. 16, 2013

(54) CONCAVE-CONVEX PATTERN FORMING METHOD AND MAGNETIC TUNNEL JUNCTION ELEMENT FORMING METHOD

(75) Inventors: Tomotaka Ariga, Kawasaki (JP); Yuichi Ohsawa, Yokohama (JP); Junichi Ito, Yokohama (JP); Yoshinari Kurosaki, Kawasaki (JP); Saori Kashiwada, Yokohama (JP); Toshiro Hiraoka, Yokohama (JP); Minoru Amano, Sagamihara (JP); Satoshi Yanagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/300,062

(22) Filed: Nov. 18, 2011

(65) Prior Publication Data

US 2012/0115250 A1     May 10, 2012

Related U.S. Application Data

(63) Continuation of application No. PCT/JP2009/059287, filed on May 20, 2009.

(51) Int. Cl.
*H01L 21/76* (2006.01)

(52) U.S. Cl.
USPC ........... 438/445; 438/551; 438/671; 438/717; 438/736; 438/950; 257/E21.023; 257/E21.035; 257/E21.038; 257/E21.039

(58) Field of Classification Search ................. 438/445, 438/671, 717, 551, 736, 950; 257/E21.035, 257/E21.038, E21.039, E21.023
See application file for complete search history.

(56) References Cited

U.S. PATENT DOCUMENTS

| 7,692,860 B2 | 4/2010 | Sato et al. |
| 7,902,074 B2 | 3/2011 | Niroomand et al. |
| 8,080,478 B2 | 12/2011 | Ohsawa et al. |

(Continued)

FOREIGN PATENT DOCUMENTS

| JP | 04-320036 | 11/1992 |
| JP | 06-077180 | 3/1994 |
| JP | 2000-173979 | 6/2000 |

OTHER PUBLICATIONS

International Preliminary Report on Patentability with Written Opinion issued Dec. 22, 2011, in International application No. PCT/JP2009/059287 (English translation).

International Search Report mailed on Aug. 11, 2009, issued for International Application No. PCT/JP2009/059287, filed on May 20, 2009.

*Primary Examiner* — Kimberly Rizkallah
*Assistant Examiner* — Maria Ligai
(74) *Attorney, Agent, or Firm* — Oblon, Spivak, McClelland, Maier & Neustadt, L.L.P.

(57) ABSTRACT

A method of forming a concave-convex pattern according to an embodiment includes: forming a guide pattern on a base material, the guide pattern having a convex portion; forming a formative layer on the guide pattern, the formative layer including a stacked structure formed by stacking a first layer and a second layer, the first layer including at least one element selected from a first metal element and a metalloid element, the second layer including a second metal element different from the first metal element; selectively leaving the formative layer only at side faces of the convex portions by performing etching on the formative layer; removing the guide pattern; and forming the concave-convex pattern in the base material by performing etching on the base material, with the remaining formative layer being used as a mask.

7 Claims, 17 Drawing Sheets

U.S. PATENT DOCUMENTS

2003/0170985 A1* 9/2003 Hwang et al. .................. 438/689
2005/0051829 A1* 3/2005 Goto et al. .................... 257/310
2007/0049040 A1* 3/2007 Bai et al. ....................... 438/712
2009/0130851 A1* 5/2009 Hasegawa et al. ............ 438/694

* cited by examiner g₁: LAYER CONTAINING Si AS PRINCIPAL ELEMENT
g₂: LAYER CONTAINING Al AS PRINCIPAL ELEMENT

CONCAVE-CONVEX PATTERN FORMING METHOD AND MAGNETIC TUNNEL JUNCTION ELEMENT FORMING METHOD

CROSS-REFERENCE TO RELATED APPLICATION

This application is based upon and claims the benefit of priority from prior PCT/JP2009/059287 filed on May 20, 2009, the entire contents of which are incorporated herein by reference.

FIELD

Embodiments described herein relate generally to a concave-convex pattern forming method and a magnetic tunnel junction element forming method.

BACKGROUND

In recent years, fine pattern forming methods have been actively researched and developed particularly in the field of the semiconductor industry.

Conventionally, patterns have been formed by exposure methods with high productivities, and miniaturization has been achieved by making the wavelengths of light sources shorter. However, the exposure methods have problems that mask widths cannot be reduced, controllability on mask size is poor, and there are fluctuations in mask width. Therefore, pattern formation by sidewall transfers that do not cause such problems has attracted attention. By the sidewall transfer method, a formative layer for forming a concave-convex pattern is formed on the periphery of a guide pattern formed by an exposure method or the like, and trimming is performed on the formative layer by etching, selectively leaving the formative layer. In this manner, a concave-convex pattern is formed. One of the advantages of the sidewall transfer method is that smaller patterns than the miniaturization limit that is set by the exposure methods can be formed.

By the sidewall transfer method, however, a rectangular concave-convex pattern having corners each forming almost a right angle is preferably formed in the trimming of the formative layer, and it is necessary to prevent rounding of the corners. In the formation of a rectangular concave-convex pattern, a high etching anisotropy is required, and dry etching is mainly used.

Dry etching involves both chemical etching components using chemical reactions and physical etching components using energy of particle collisions. Etching progresses isotropically in chemical etching components, and anisotropically in physical etching components. Where etching progresses isotropically, a high anisotropy cannot be achieved. Therefore, to achieve a high anisotropy, it is critical to restrain chemical etching components.

In a sidewall transfer, the formative layer for forming a concave-convex pattern is made of a single material, and accordingly, the groove side faces the groove bottom faces of the formative layer are made of the same material. Therefore, almost the same chemical etching progresses in the groove side faces and the groove bottom faces, and the etching anisotropy becomes lower. At shallow portions of the grooves, etched faces having components perpendicular to the etching direction are formed by isotropic etching. The influence of physical etching then becomes larger in those faces, and etching perpendicular to the etching direction progresses, resulting in rounding of the "shoulders." Therefore, the sidewall transfer method has the problem that almost the same chemical etching progresses in the groove side faces and the groove bottom faces of the formative layer, and rounding of the "shoulders" occurs. Rounding of the "shoulders" means that the corners of the upper portions of the formative layer are partially removed and rounded at the time of removal of the groove bottom faces of the formative layer. In general, high rectangular properties are preferred in the shapes of etching masks in semiconductor device manufactures, the shapes of imprint patterns, and the shapes of etching masks in MTJ processing. When rounding of the "shoulders" occurs, however, a concave-convex pattern having rectangular properties cannot be formed.

Since the formative layer is formed on the periphery of a guide pattern having different film stresses, an internal stress occurs at the interface between the formative layer and the guide pattern. Due to the occurrence of an internal stress, the formative layer is warped after the guide pattern is removed. Where the formative layer is warped, the shape of the formative layer or the shape of a pattern transferred from the formative layer changes. Therefore, the problem with the sidewall transfer method lies in that the formative layer is warped due to the stress occurring at the interface between the guide pattern and the formative layer.

As described above, the conventional sidewall transfer method has the problem of rounding of the "shoulders" of the convex portions of a concave-convex pattern.

DETAILED DESCRIPTION

Figure 1:
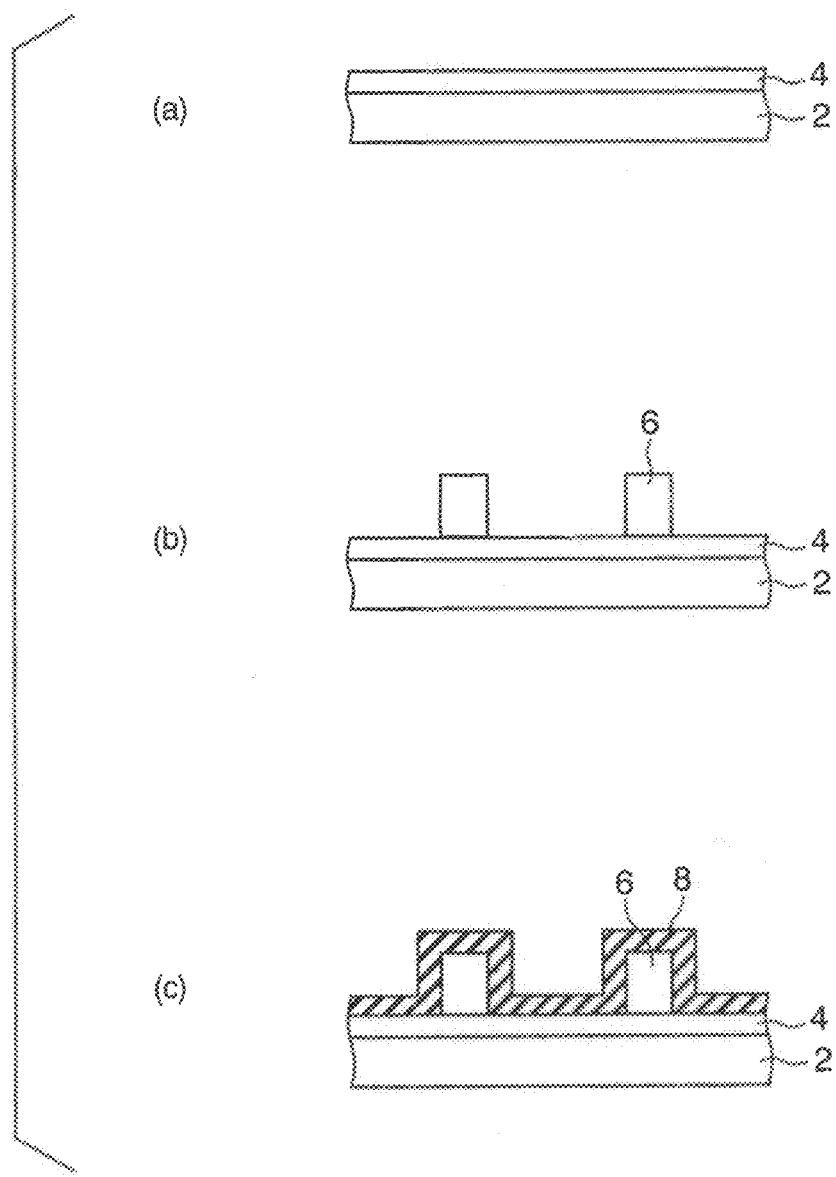
FIGS. 1(a) through 1(c) are cross-sectional views illustrating procedures to be carried out by a concave-convex pattern forming method according to a first embodiment.
Figure 2:
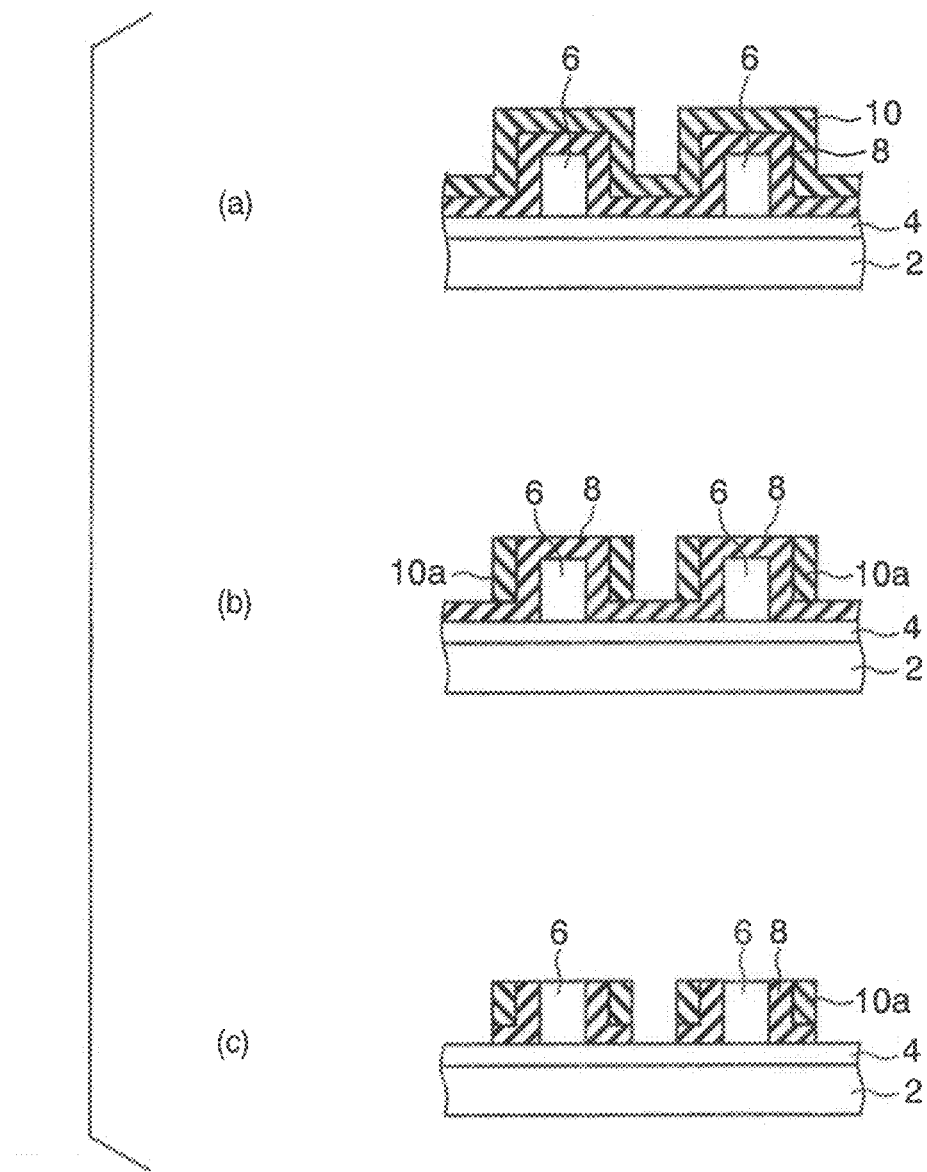
FIGS. 2(a) through 2(c) are cross-sectional views illustrating procedures to be carried out by a concave-convex pattern forming method according to the first embodiment.
Figure 3:
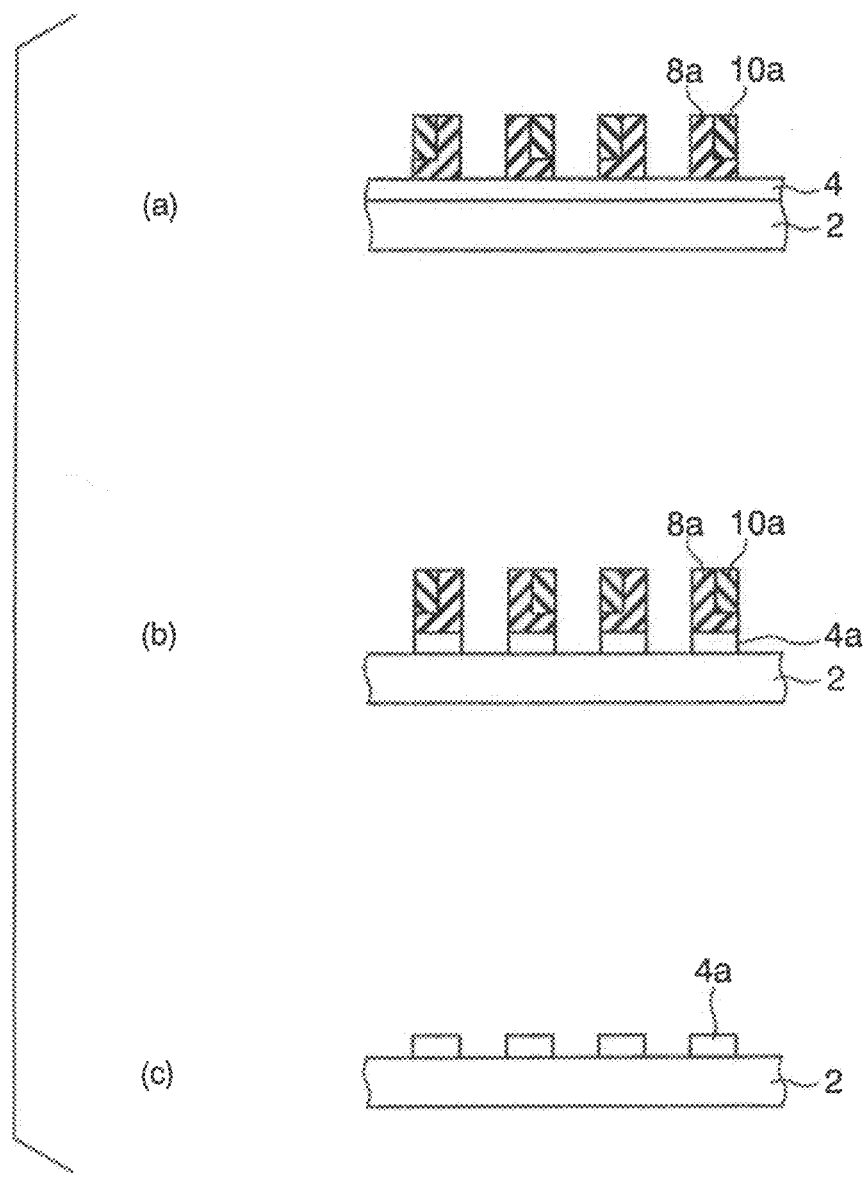
FIGS. 3(a) through 3(c) are cross-sectional views illustrating procedures to be carried out by a concave-convex pattern forming method according to the first embodiment.

A concave-convex pattern forming method according to an embodiment includes: forming a guide pattern on a base material, the guide pattern having a convex portion; forming a formative layer on the guide pattern, the formative layer including a stacked structure formed by stacking a first layer and a second layer, the first layer including at least one element selected from a first metal element and a metalloid element, the second layer including a second metal element different from the first metal element; selectively leaving the formative layer only at side faces of the convex portions by performing etching on the formative layer; removing the guide pattern; and forming the concave-convex pattern in the base material by performing etching on the base material, with the remaining formative layer being used as a mask.

The following is a description of embodiments, with reference to the accompanying drawings.

First Embodiment

FIGS. 1(a) through 3(c) illustrate a concave-convex pattern forming method according to a first embodiment.

First, as shown in FIG. 1(a), a base material on which a concave-convex pattern is to be formed is prepared. The base material can be a silicon substrate, or can be formed by forming a foundation layer 4 made of, for example, amorphous silicon on a silicon substrate 2. In this embodiment, the latter base material is used. As shown in FIG. 1(b), a guide pattern (a core material) 6 having convex portions and concave portions arranged in a pattern is formed on the base material. The guide pattern is the core of the layer for forming the concave-convex pattern. By a specific example of a method of forming the guide pattern 6, a carbon layer is formed on the foundation layer 4 by chemical vapor deposition (CVD) or a sputtering technique, and a resist is applied onto the carbon layer. Baking is then performed to form a resist layer. Patterning is then performed on the resist layer by a lithography technique, to form a resist pattern. With the resist pattern being used as a mask, patterning is performed on the carbon layer by dry etching, to form a guide pattern made of carbon. After the resist pattern is removed, the line width of the guide pattern made of carbon is slimmed by using an oxygen ashing technique. An example shape size of the guide pattern is 5 nm in line width, 20 nm in pitch, and 10 nm in height. By other specific examples of the method of forming a guide pattern, patterning is performed on a reflection preventing film coated with a spin coating by a lithography technique, a resin pattern is formed by imprinting, or a pattern is formed through self-organization.

As shown in FIG. 1(c), a lower layer 8 containing at least one etching-resistant element selected from metal elements or metalloid elements is formed for forming the concave-convex pattern to cover the guide pattern 6. The lower layer 8 is formed by using a technique such as Atomic Layer Deposition (ALD), CVD, or sputtering. As will be described later, it is preferable to use ALD. For example, by using tris(dimethylamino)silane or bis(dimethylamino)silane as a precursor, a silicon oxide layer of 4 nm in film thickness is formed, by ALD, as the lower layer 8 to cover the guide pattern 6.

As shown in FIG. 2(a), by using a precursor such as trimethylaluminum, an aluminum oxide layer 10 of 1 nm in film thickness, for example, is formed, by ALD, as an upper layer on the silicon oxide layer 8 serving as the lower layer. The upper layer contains a metal element for forming the concave-convex pattern. Other than the above described materials, tantalum can be used as the lower layer, and aluminum oxide may be used as the upper layer. That is, where the lower layer contains a metal, the metal preferably differs from the metal contained in the upper layer.

Figure 5:
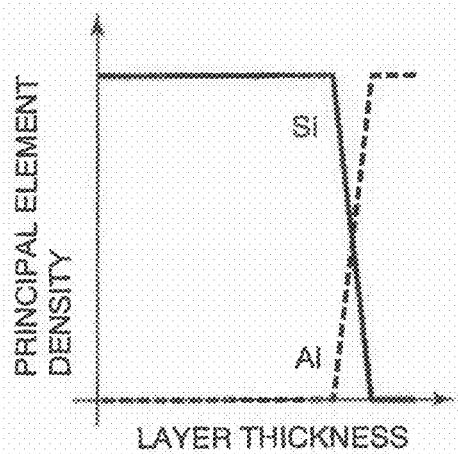
FIG. 5 is a graph showing the distributions of principal elements in the layer thickness direction of a formative layer formed by a forming method according to the first embodiment.

In this embodiment, as the formative layer for forming the concave-convex pattern, the lower layer 8 is formed with a silicon oxide layer, and the upper layer 10 is formed with an aluminum oxide layer. FIG. 5 shows the distributions of the principal elements in the layer thickness direction of the formative layer immediately after the lower layer 8 and the upper layer 10 are formed. As can be seen from FIG. 5, in the vicinity of the interface between the lower layer 8 and the upper layer 10, the distributions of the principal elements have slopes, since a mixed layer is formed by molecular diffusion.

As shown in FIG. 2(b), upper layer trimming is then performed. At this point, the upper layer trimming means that the upper layer 10 for forming the concave-convex pattern is selectively removed. To perform the upper layer trimming, anisotropic etching such as argon ion milling is performed, or reactive ion etching (RIE) is performed on a parallel plate by using a methane trifluoride gas or a methane tetrafluoride gas. In this manner, the aluminum oxide layer 10 is selectively removed, to leave aluminum oxide layers 10a only at the side portions of the silicon oxide layer 8 serving as the lower layer. As a result, the upper faces of the silicon oxide layer 8, or the upper faces of the convex portions and the upper faces of the groove portions of the silicon oxide layer 8, are exposed.

As shown in FIG. 2(c), lower layer trimming is then performed. At this point, the lower layer trimming means that part of the lower layer 8 for forming the concave-convex pattern is selectively removed. In this embodiment, of the lower layer 8 that is exposed through the upper layer trimming and is designed for forming the concave-convex pattern, the silicon oxide layer portions of the groove portions are selectively removed, and silicon oxide layers 8a of the convex portions are selectively left.

As an example of a removal method, the lower layer 8 for forming the concave-convex pattern is selectively removed by RIE performed on a parallel plate with the use of a methane trifluoride gas or a methane tetrafluoride gas. The RIE is performed under the following conditions: the gas composition is methane trifluoride, the gas pressure is 1 Pa, the bias power is 150 W, and the etching time is 10 seconds, for example.

In this embodiment, the upper layer 10 for forming the concave-convex pattern is made of aluminum oxide, and the lower layer 8 is made of silicon oxide. As the upper layer trimming, RIE using methane trifluoride or methane tetrafluoride is performed. While the silicon oxide having a high etching rate in the lower layer trimming is exposed through the bottom faces of the groove portions, the side faces of the groove portions are covered with the aluminum oxide having a low etching rate. As a result, the etching in the lower layer trimming progresses selectively in the bottom faces of the groove portions, but hardly progresses in the side faces of the groove portions. Therefore, rounding of the "shoulders" in the side faces of the groove portions can be restrained.

In this embodiment, the formative layer for forming the concave-convex pattern exhibits different etching rates, since the principal elements vary in the layer thickness direction. If the formative layer is formed through the lower layer trimming so that the etching rate becomes lower on the upper layer side and higher on the lower layer side, a difference in layer thickness is generated between the bottom face and the side faces of each groove portion after the upper layer trimming is performed on such a formative layer. Due to the difference in layer thickness, the etching rate of the bottom faces of the groove portions becomes higher than that of the side faces of the groove portions. Although etching can be readily performed on the groove bottom faces having the higher etching rate, it is difficult to perform etching on the groove side faces having the lower etching rate. As a result, rounding of the "shoulders" can be restrained. That is, in this embodiment, rounding of the "shoulders" is restrained by using the material selectivities of the etching rates.

Further, rounding of the "shoulders" can be restrained not only by the high material selectivities of the etching rates of the upper layer material and the lower layer material in the lower layer etching, but also by the high etching angle dependence of the upper layer and the high film thickness controllability and small thickness of the upper layer.

Next, the high material selectivities of the etching rates of the upper layer material and the lower layer material in the lower layer etching is described. In conventional RIE as a method of performing etching to form a fine pattern, gas molecules in a highly reactive state, or radicals, react chemically with the principal element of the material to be etched, and turn into a highly volatile compound. This compound then volatilizes, which is one of the principal causes of the etching progress. Therefore, the etching progress greatly varies depending on the reactivity with gas molecules and the volatility of the generated compound. Accordingly, by selecting a gaseous species and the principal element of the material to be etched so that differences in the reactivity and the volatility can be generated, the material selectivity of the etching rate of the material to be etched can be made higher.

In this embodiment, silicon oxide is used as the lower layer 8, and aluminum oxide is used as the upper layer 10. Those materials are now described from the standpoint of the material selectivities of the etching rates. In the RIE of the silicon oxide with the use of methane trifluoride or methane tetrafluoride, fluorine and silicon, which is the principal element of the lower layer 8, bind to each other and volatilize, and then the etching progresses, as indicated by the following formula (1):

$$SiO_2 + 4F \rightarrow SiF_4 + O_2 \qquad (1)$$

Meanwhile, in the aluminum oxide, aluminum, which is the principal element of the upper layer 10, and fluorine bind to each other, as indicated by the following formula (2):

$$Al + 3F \rightarrow AlF_3 \qquad (2)$$

Figure 4:
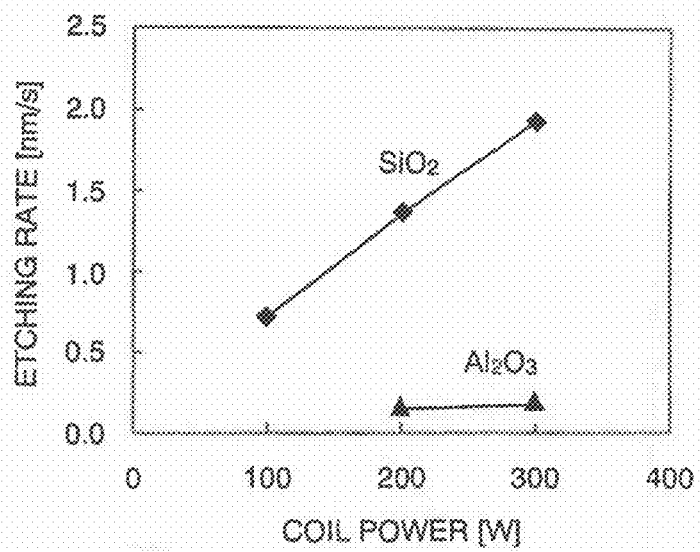
FIG. 4 is a diagram for explaining the difference in etching rate between silicon oxide and aluminum oxide.

However, this aluminum compound has low volatility, and hardly volatilizes in the atmosphere in which the RIE is performed. Therefore, the etching hardly progresses. The results of actual measurement of etching rates also confirm that there is a difference in etching rates between the silicon oxide and the aluminum oxide (see FIG. 4). In FIG. 4, the abscissa axis indicates the coil power for generating RF discharge during the RIE, and the ordinate axis indicates the etching rate.

That is, between a material containing silicon as the principal element and a material containing aluminum as the principal element, there is a difference in the volatility of the compound generated as a result of binding to the fluorine in a methane trifluoride gas or a methane tetrafluoride gas. Because of the difference in volatility, the material selectivities of etching rates can be achieved.

In this embodiment where the lower layer 8 is made of silicon oxide, the upper layer 10 is made of aluminum oxide, and RIE is performed with the use of methane trifluoride or methane tetrafluoride, the material selectivities of etching rate achieved, because of the above described difference in compound volatility.

Next, the etching angle dependence of the upper layer 10 is described. In the upper layer trimming, the portions of the upper layer 10 formed near the side portions of the guide pattern 6 are left, and etching is selectively performed on the portions of the upper layer 10 formed above the bottom faces of the groove portions.

The portions of the upper layer 10 formed near the side portions of the guide pattern 6 are subjected to etching at an angle substantially parallel to the film plane, and the portions of the upper layer 10 formed above the bottom faces of the groove portions are subjected to etching at an angle substantially perpendicular to the film plane. Therefore, the upper layer 10 preferably has a low etching rate against the etching performed at the angle substantially parallel to the film plane, and preferably has a high etching rate against the etching performed at the angle substantially perpendicular to the film plane. As the difference in etching rates between the substantially horizontal etching and the substantially vertical etching becomes larger, the anisotropy of the upper layer trimming and the anisotropy of the entire trimming are improved. The etching angle dependence varies with materials to be etched. Therefore, a material having high etching angle dependence needs to be selected as the upper layer 10.

The etching angle dependence is achieved with aluminum oxide. In this embodiment where the upper layer 8 is made of aluminum oxide achieving the etching angle dependence, the anisotropy of the entire trimming is high. When aluminum oxide is used as the upper layer 10 while silicon oxide is used as the lower layer 8, a methane trifluoride gas or a methane tetrafluoride gas can be used as the etching gas for the RIE in both the upper layer trimming and the lower layer trimming. Accordingly, both trimming processes can be continuously performed by the same machine, without a change of etching gases. As a result, the production costs become lower.

Next, the layer thicknesses of the upper layer 10 and the lower layer 8 of the formative layer for forming the concave-convex pattern are described. The portions of the upper layer 10 formed along the sidewalls of the groove portions of the concave-convex pattern need to remain even after both the upper layer trimming process and the lower layer trimming process are performed. That is, the film thickness $d_{SP}$ of the upper layer 10 needs to be greater than the length of the side etching in both the upper layer trimming process and the lower layer trimming process. The layer thicknesses of the upper layer 10 and the lower layer 8 are determined from the etching selectivity depending on the etching anisotropy and the materials to be etched.

The minimum layer thickness $d_{SP, min}$ of the upper layer 10 is determined as follows. The conditions under which the upper layers 10a formed near the side faces of the guide pattern 6 remain when the trimming of the upper layer 10 and the lower layer 8 is completed are determined. The layer thickness $d_{SP}$ of the upper layer 10 needs to be greater than the length of the side etching performed by the trimming of the upper layer 10 and the lower layer 8. The conditions for the upper layer 10a to remain are expressed by the following mathematical expression (3):

$$d_{SP} \geq L_{SP,BT} + L_{SP,SWE} \quad (3)$$

At this point, $d_{SP}$ represents the layer thickness (nm) of the upper layer 10, $L_{SP, BT}$ represents the side etching length (nm) of the upper layer 10 in the upper layer trimming process, and $L_{SP, SWE}$ represents the side etching length (nm) of the upper layer 10 in the lower layer trimming process. The side etching length $L_{SP, BT}$ of the upper layer 10 in the upper layer trimming process is expressed by the following mathematical expression (4):

$$\begin{aligned}L_{SP,BT} &= r_{SP,Side,BT} \cdot t_{BT} \quad (4) \\ &= r_{SP,Side,BT} \cdot \frac{d_{SP}}{r_{SP,Bottom,BT}} \\ &= \left(\frac{r_{SP,Bottom,BT}}{r_{SP,Side,BT}}\right)^{-1} \cdot d_{SP} \\ &= A_{BT}^{-1} \cdot d_{SP}[\text{nm}]\end{aligned}$$

At this point, $r_{SP, Side, BT}$ represents the lateral etching rate (nm/s) of the upper layer 10 in the upper layer trimming process, $t_{BT}$ represents the trimming time (s) for the upper layer 10, $r_{SP, Bottom, BT}$ represents the vertical etching rate (nm/s) of the portions of the upper layer 10 formed above the bottom faces of the groove portions in the upper layer trimming process, and $A_{BT}$ represents the etching anisotropy in the upper layer trimming process. The side etching length $L_{SP, SWE}$ of the upper layer 10 in the lower layer trimming process is expressed by the following mathematical expression (5):

$$\begin{aligned}L_{SP,SWE} &= r_{SP,Side,SWE} \cdot t_{SWE} \quad (5) \\ &= r_{SP,Side,SWE} \cdot \frac{d_{SW}}{r_{SW,Bottom,SWE}} \\ &= \frac{r_{SP,Side,SWE}}{r_{SW,Bottom,SWE}} \cdot d_{SW} \\ &= \left(\frac{r_{SW,Bottom,SWE}}{r_{SP,Side,SWE}}\right)^{-1} \cdot d_{SW} \\ &= A_{SWE}^{-1} \cdot d_{SW}[\text{nm}]\end{aligned}$$

At this point, $r_{SP, Side, SWE}$ represents the lateral etching rate (nm/s) of the upper layer 10 in the lower layer trimming process, $t_{SWE}$ represents the lower layer trimming time (s), $r_{SW, Bottom, SWE}$ represents the vertical etching rate (nm/s) of the portions of the lower layer 8 formed on the bottom faces of the groove portions in the lower layer trimming process, and $A_{SWE}$ represents the etching anisotropy in the lower layer trimming process.

According to the mathematical expressions (3), (4), and (5), the conditions for the upper layer 10 to remain are expressed by the following mathematical expression (6):

$$d_{SP} \geq \frac{A_{SWE}^{-1}}{1 - A_{BT}^{-1}} \cdot d_{SW}[\text{nm}] \quad (6)$$

After the trimming process for the lower layer 8, the following mathematical expression (7) should be satisfied so that the total layer thickness of the upper layer 10 and the lower layer 8 becomes equal to a design pattern width hp:

$$d_{SP}' + d_{SW} = hp[nm] \quad (7)$$

At this point, $d_{SP}'$ represents the layer thickness (nm) of the upper layer 10 at the end of the trimming of the lower layer 8, and hp represents the design pattern width (nm).

The thickness $d_{SP}'$ of the upper layer 10 after the lower layer trimming is determined by subtracting the side etching length from the initial layer thickness, and is expressed by the following mathematical expression (8):

$$d_{SP}' = d_{SP} - (L_{SP,BT} + L_{SP,SWE})[nm] \quad (8)$$

According to the mathematical expressions (4), (5), and (8), the following mathematical expression (9) is established:

$$d_{SP}' = (1 - A_{BT}^{-1}) \cdot d_{SP} - A_{SWE}^{-1} \cdot d_{SW}[nm] \quad (9)$$

When the thickness of the upper layer 10 is set to the lower limit value, or where the upper layer 10 vanishes at the same time as the end of the trimming process for the lower layer 8, the thickness of the lower layer 8 is expressed by the following mathematical expression (10) according to the mathematical expression (7):

$$d_{SW} = hp \; [nm](d_{SP}' = 0[nm]) \quad (10)$$

Where the mathematical expression (10) is satisfied, the thickness $d_{SP}$ of the upper layer 10 becomes the minimum value $d_{SP, min}$, and, according to the mathematical expressions (9) and (10), the $d_{SP, min}$ of the thickness of the upper layer 10 is expressed by the following mathematical expression (11):

$$d_{SP,min} = \frac{A_{SWE}^{-1}}{1 - A_{BT}^{-1}} \cdot hp[nm] \quad (11)$$

According to the mathematical expressions (4), (5), (7), and (9), the layer thickness of the lower layer 8 is expressed by the following mathematical expression (12):

$$d_{SW} = \frac{hp - (1 - A_{BT}^{-1}) \cdot d_{SP}}{1 - A_{SWE}^{-1}}[nm] \quad (12)$$

With the upper layer trimming and the lower layer trimming being combined, the etching anisotropy A of the entire trimming is determined. At the groove bottom portions, both the upper layer 10 and the lower layer 8 are subjected to vertical etching. At the groove side portions, the lateral film thinning occurs in the upper layer 10. Based on the ratio between the vertical etching length and the lateral etching length, the etching anisotropy A of the entire trimming is expressed by the following mathematical expression (13):

$$A = \frac{d_{SP} + d_{SW}}{d_{SP} - d'_{SP}} \quad (13)$$

According to the mathematical formulas (7), (12), and (13), the etching anisotropy A of the entire trimming is expressed as follows:

$$A = \left[1 - \frac{1}{\frac{1}{1-A_{SWE}^{-1}} + \left(1 - \frac{1-A_{BT}^{-1}}{1-A_{SWE}^{-1}}\right) \cdot \frac{d_{SP}}{hp}}\right]^{-1} \quad (14)$$

Figure 6:
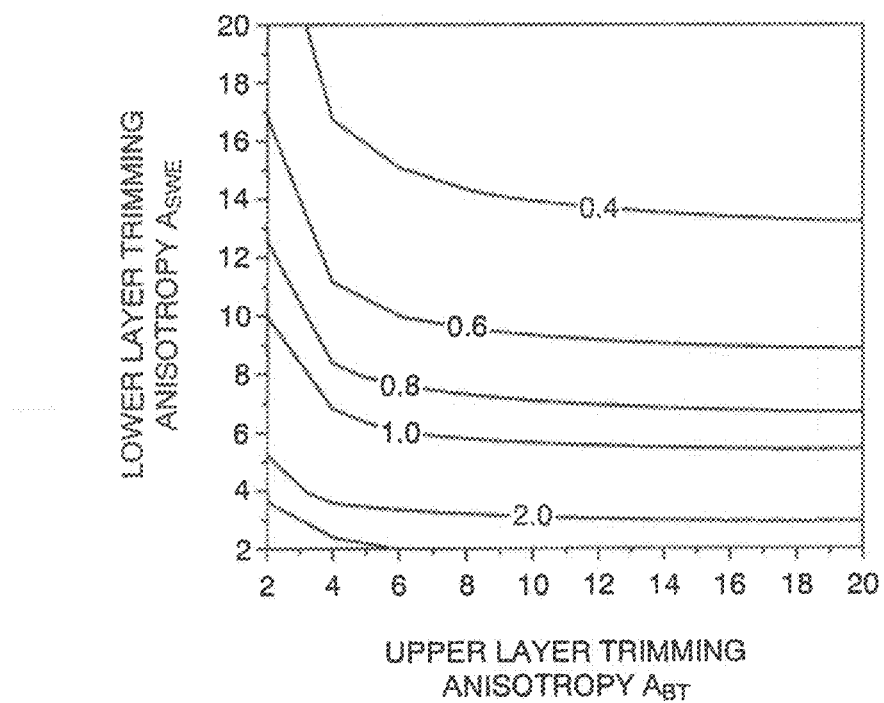
FIG. 6 is a graph showing necessary film thicknesses of the upper layer of the formative layer.

FIG. 6 shows the necessary film thicknesses of the upper layer 10 where the width of each convex portion of the concave-convex pattern is 5 nm. In FIG. 6, the abscissa axis indicates the etching anisotropy $A_{BT}$ in the upper layer trimming process, and the ordinate axis indicates the etching anisotropy $A_{SWE}$ in the lower layer trimming process. Where the etching anisotropy in the upper layer trimming process is 4 while the etching anisotropy in the lower layer trimming process is 16, the necessary film thickness of the upper layer 10 of the formative layer for forming the concave-convex pattern is approximately 0.4 nm. The actual film thickness of the upper layer 10 is determined by adding the etching margin to the necessary film thickness.

Figure 20:
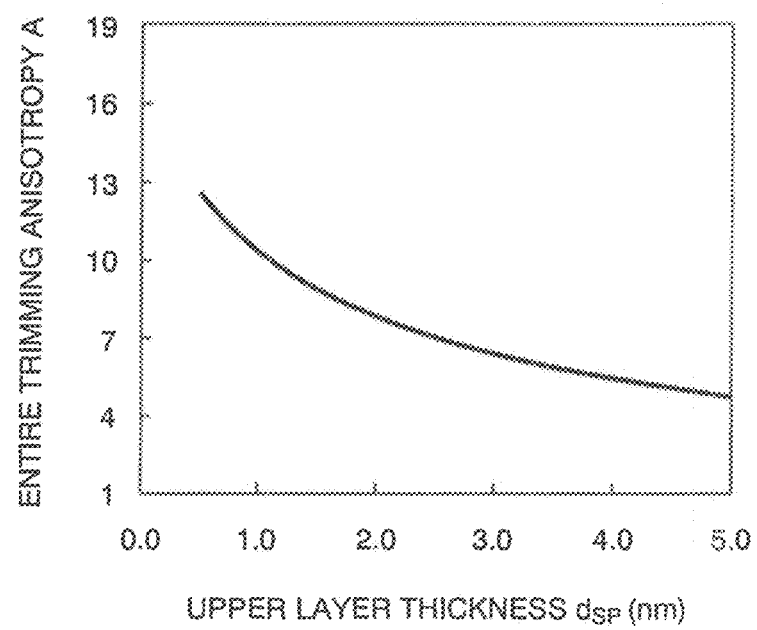
FIG. 20 is a graph showing the relationship between the thickness of the upper layer of a formative layer and the anisotropy of entire trimming.

Based on the mathematical expression (14), the relationship between the upper layer thickness and the etching anisotropy of the entire trimming is determined, and the relationship is shown in FIG. 20. In FIG. 20, the abscissa axis indicates the upper layer thickness, and the ordinate axis indicates the etching anisotropy of the entire trimming. As the upper layer 10 becomes thinner, the etching anisotropy of the entire trimming is improved. Therefore, the upper layer thickness is preferably small but is equal to or greater than the necessary film thickness. Further, as the anisotropy is improved, variations of the widths of the convex portions of the concave-convex pattern due to variations of the anisotropy can be restrained. That is, by forming a thin upper layer, the anisotropy is improved, and variations of the widths of the convex portions of the concave-convex pattern can be restrained. Having higher film thickness controllability compared with CVD, ALD has an advantage in forming a thin film. Therefore, it is preferable to use ALD in forming the thin upper layer 10. Based on the above described calculations, the film thickness of the upper layer 10 is 1 nm, and the film thickness of the lower layer 8 is 4.5 nm. Silicon oxide and aluminum oxide are materials that can be formed into films by ALD. Therefore, it is preferable to form a 1-nm thick aluminum oxide layer as the upper layer 10 and a 4.5-nm thick silicon oxide layer as the lower layer 8 by ALD. As will be described later, from the standpoint of stress, ALD is also considered advantageous in forming the formative layer.

In this embodiment where the lower layer 8 is made of silicon oxide, the upper layer 10 is made of aluminum oxide, and RIE is performed with the use of methane trifluoride or methane tetrafluoride, the material selectivities of etching rates are achieved by virtue of the above described difference in compound volatility, the lower layer 8 has angle dependence with respect to etching, and both the lower layer 8 and the upper layer 10 are made of materials that can be formed into thin films by ALD with high film thickness controllability.

Combinations of materials in the formative layer in which RIE using a methane trifluoride gas and a methane tetrafluoride gas is performed for trimming the lower layer are now described. A multilayer structure in which the upper layer 10 made of a material not containing silicon is formed on the lower layer 8 made of a silicon compound is preferred as the formative layer for forming the concave-convex pattern.

In other combinations of materials, a layer containing a metalloid element such as boron, silicon, germanium, arsenic, antimony, selenium, or tellurium as the principal element is used as the lower layer 8. However, it is preferable to use a layer containing silicon as the principal element. For example, silicon, silicon oxide, silicon nitride, or a mixture of those materials is used. As the upper layer 10, a layer containing a metal element as the principal element, such as aluminum oxide, titanium oxide, tantalum oxide, platinum, ruthenium, iridium, palladium, copper, cobalt, nickel, or a mixture of those materials is used.

ALD is a film forming method by which molecules are deposited in each molecular layer. Therefore, film thickness control on the atomic layer level can be performed by ALD, which is suitable as a method of forming the upper layer in a case where a concave-convex pattern having convex portion widths of 10 nm or smaller is to be formed.

By a conventional sidewall transfer technique, stresses are generated in the interface between the guide pattern and the formative layer for forming the concave-convex pattern. When the guide pattern is removed, warpage appears in the concave-convex pattern due to the stresses, and a rectangular pattern cannot be obtained.

In this embodiment, however, materials having different film stresses from each other, or aluminum oxide and silicon oxide, are used as the upper layer 10a and the lower layer 8a constituting the formative layer for forming a concave-convex pattern. With this arrangement, the film stress of the upper layer 10a and the film stress of the lower layer 8a are matched, and warpage can be restrained. The materials to be combined are preferably selected so that, in a case where the upper layer 10 serves as a compressive stress, the lower layer 8 serves as a tensile stress, and, in a case where the upper layer 10 serves as a tensile stress, the lower layer 8 serves as a compressive stress.

For example, a layer containing a metalloid element such as boron, silicon germanium, arsenic, antimony, selenium, or tellurium, or a tantalum layer is used as the lower layer 8. However, it is preferable to use a layer containing silicon as the principal element. For example, silicon, silicon oxide, silicon nitride, or a mixture of those materials is used. As the upper layer 10, a layer containing a metal element as the principal element, such as aluminum oxide, titanium oxide, tantalum oxide, platinum, ruthenium, iridium, palladium, copper, cobalt, nickel, or a mixture of those materials is used.

The effect to restrain warpage can be achieved not only in a structure in which the composition of the layer forming a concave-convex pattern discontinuously varies in the layer thickness direction as in this embodiment, but also in a case where the compositions vary stepwise as described later in a third embodiment.

In FIG. 2(c), the upper faces of the remaining silicon oxide layers 8a and the upper faces of the remaining aluminum oxide layers 10a are located substantially in the same plane. The inventors consider this aspect as follows. The silicon oxide layers 8a with a high etching rate are first etched, and the thin angular aluminum oxide layers 10a with large exposed areas remain. The thin angular aluminum oxide layers 10a are then etched. Those procedures are repeated, so that the upper faces of the remaining silicon oxide layers 8a and the upper faces of the remaining aluminum oxide layers 10a are located substantially in the same plane.

In this embodiment, the upper layer 10 for forming a concave-convex pattern is made of aluminum oxide, and the lower layer 8 is made of silicon oxide. After the portions of the upper layer 10 formed above the bottom faces of the groove portions are selectively removed, the silicon oxide in which the etching by RIE readily progresses is exposed through the bottom faces of the groove portions, but the side faces of the groove portions are covered with the aluminum oxide in which the etching hardly progresses. As a result, the etching by the RIE progresses selectively in the bottom faces of the groove portions, but hardly progresses in the side faces of the groove portions. Therefore, rounding of the "shoulders" in the side faces of the groove portions can be restrained. Further, as described above, in a case where RIE is performed with the use of a methane trifluoride gas or a methane tetrafluoride gas, a multilayer structure in which the upper layer 10 made of a material not containing silicon is formed on the lower layer 8 made of a silicon compound is preferred as the formative layer for forming the concave-convex pattern. In other material combinations, a layer containing a metalloid element such as boron, silicon, germanium, arsenic, antimony, selenium, or tellurium as the principal element, or a tantalum layer is used as the lower layer 8. However, it is preferable to use a layer containing silicon as the principal element. For example, silicon, silicon oxide, silicon nitride, or a mixture of those materials is used. As the upper layer 10, a layer containing a metal element as the principal element, such as alumina, titanium oxide, tantalum oxide, platinum, ruthenium, iridium, palladium, copper, cobalt, nickel, or a mixture of those materials is used.

As shown in FIG. 3(a), the guide pattern 6 is removed by using oxygen RIE. Through the removal, the formative layer for forming the concave-convex pattern having narrower pitch than that of the guide pattern 6 is obtained.

The concave-convex pattern formed as described above is used as a mask, and etching is performed on the foundation layer 4, to transfer the concave-convex pattern to the foundation layer 4 (see FIG. 3(b)). As the concave-convex pattern is transferred to the foundation layer 4 by performing etching as above, the rectangularity of the pattern can be increased.

As shown in FIG. 3(c), the concave-convex pattern formed with the lower layer 8a and the upper layer 10a is removed by etching. The removal of the concave-convex pattern is performed by RIE using a sulfur hexafluoride gas or a hydrobromic acid gas as the etching gas, for example. The silicon substrate 2 having the concave-convex pattern formed thereon may be immersed into 5 wt % hydrofluoric acid, to remove the concave-convex pattern formed with the lower layer 8a and the upper layer 10a.

Referring now to FIGS. 7(a) through 7(d), a method of forming an imprint stamper, using a concave-convex pattern formed by the concave-convex pattern forming method according to this embodiment, is described. This stamper is used in a method of manufacturing a magnetic bit-patterned medium of a processed magnetic material type.

Figure 7:
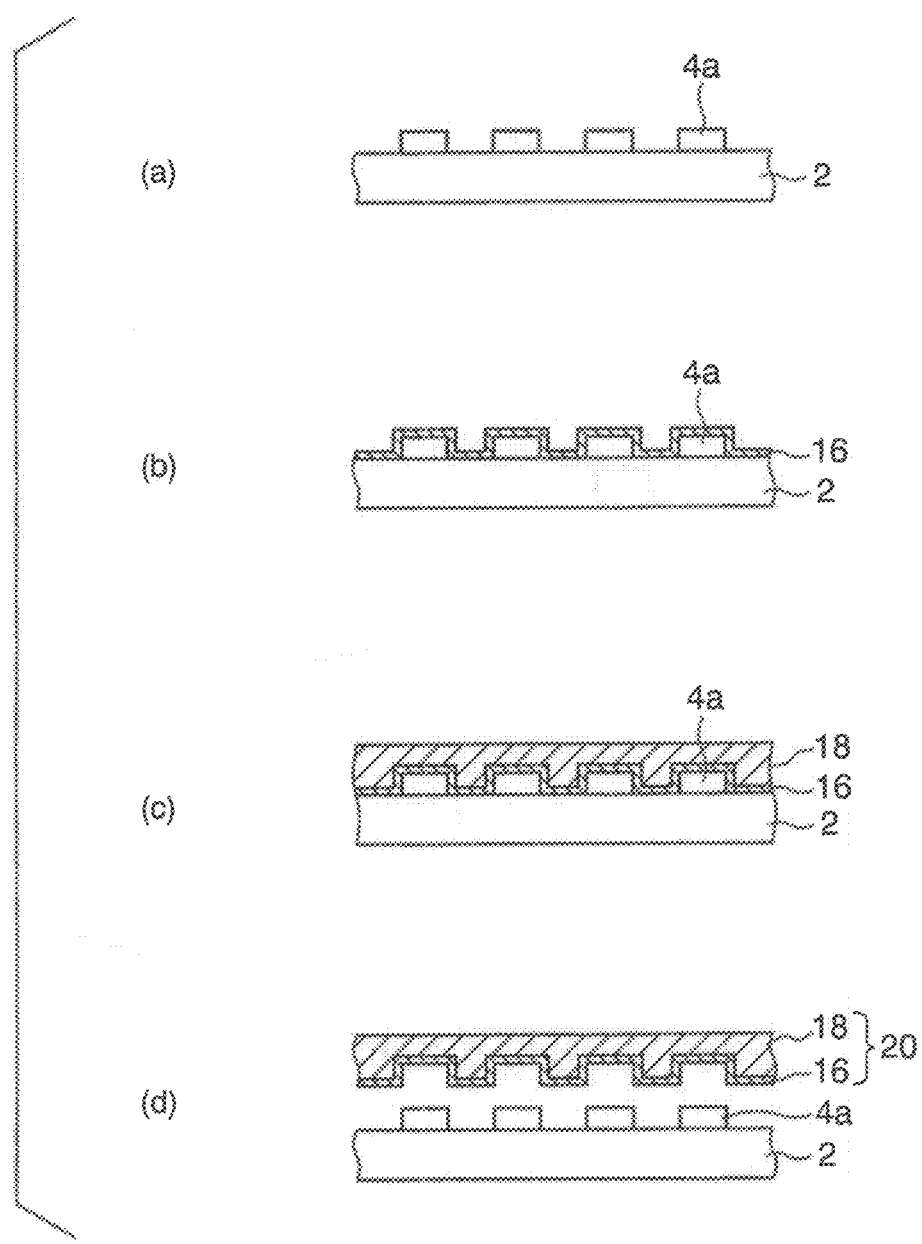
FIGS. 7(a) through 7(d) are cross-sectional views showing procedures to be carried out by a method of manufacturing a magnetic recording medium.

First, as shown in FIG. 7(a), by the concave-convex pattern forming method of this embodiment, a matrix having a concave-convex pattern 4a formed on a substrate 2 is prepared. As shown in FIG. 7(b), a thin conductive film 16 is formed on the substrate 2 by nickel sputtering or the like, so as to cover the concave-convex pattern 4a. After that, as shown in FIG. 7(c), the concave portions of the concave-convex pattern 4a are sufficiently filled with a nickel film 18 by electroforming, so as to achieve a desired film thickness. As shown in FIG. 7(d), the nickel film 18 is detached from the matrix formed with the concave-convex pattern 4a and the substrate 2, to create a stamper 20 formed with the conductive film 16 and the nickel film 18.

Referring now to FIGS. 8(a) through 8(f), a method of manufacturing a magnetic bit-patterned medium of a processed magnetic material type using the stamper 20 is described.

Figure 8:
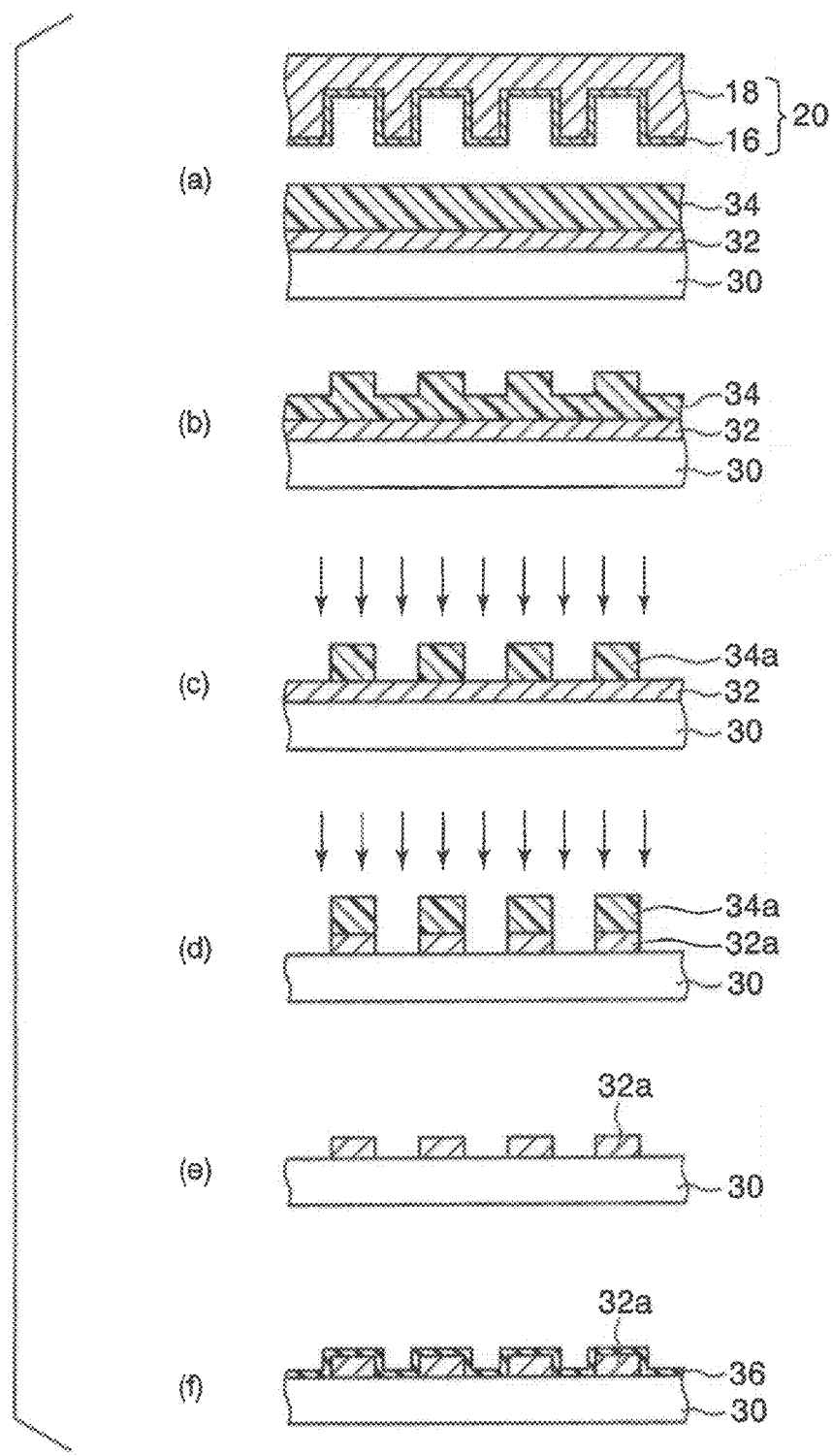
FIGS. 8(a) through 8(f) are cross-sectional views showing procedures to be carried out by the method of manufacturing a magnetic recording medium.

First, as shown in FIG. 8(a), a magnetic layer 32 to be a recording layer is formed on a substrate 30, and a resist 34 is applied onto the magnetic layer 32. In this manner, a magnetic recording medium substrate is prepared. Imprinting with the use of the above described stamper 20 is performed on the resist 34 applied onto the magnetic recording medium substrate (see FIG. 8(a)), and the pattern of the stamper 20 is transferred to the resist 34 (see FIG. 8(b)).

The pattern transferred to the resist 34 is used as a mask, and etching is performed on the resist 34, to form a resist pattern 34a (see FIG. 8(c)). After that, with the resist pattern 34a being used as a mask, ion milling is performed on the magnetic layer 32 (see FIG. 8(d)). The resist pattern 34a is then removed by dry etching or with a chemical solution, to form a discrete magnetic layer 32a (see FIG. 8(e)).

A protection film 36 is then formed on the entire surface, to complete the magnetic recording medium (see FIG. 8(f)). It should be noted that the method may include the step of filling the concave portions such as grooves with a nonmagnetic material.

The shape of the substrate on which a pattern is formed by this manufacturing method is not particularly limited, but a substrate having a disc-like shape such as a silicon wafer substrate is preferable. In that case, the disc can have notches or orientation flats. Other examples of substrates that can be used include a glass substrate, an aluminum-based alloy substrate, a ceramic substrate, a carbon substrate, and a compound semiconductor substrate. As the glass substrate, amorphous glass or crystallized glass can be used. As the amorphous glass, soda-lime glass, aluminosilicate glass, or the like can be used. As the crystallized glass, lithium-based crystallized glass or the like can be used. As the ceramic substrate, a sintered material containing aluminum oxide, aluminum nitride, silicon nitride, or the like as the main component, or any of those sintered materials that are fiber-reinforced can be used. As the compound semiconductor substrate, GaAs, AlGaAs, or the like can be used.

Referring now to FIGS. 9(a) through 9(d), a method of manufacturing a magnetic recording medium of a processed substrate type using the stamper 20 is described.

First, the stamper 20 is manufactured by the same method as the method illustrated in FIGS. 7(a) through 7(d).

Figure 9:
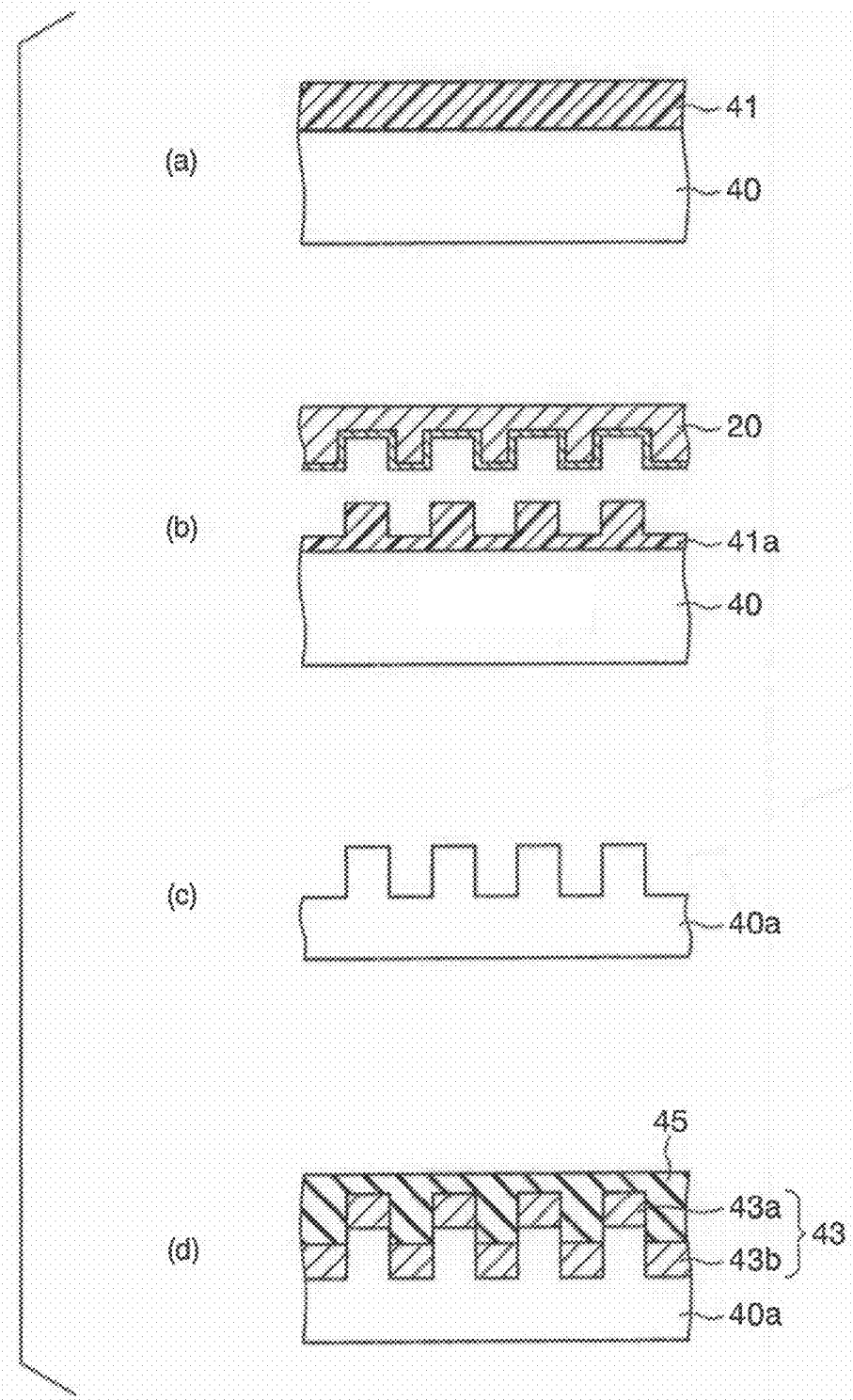
FIGS. 9(a) through 9(d) are cross-sectional views showing procedures to be carried out by another method of manufacturing a magnetic recording medium.

A concavity and convexity forming substrate is manufactured by using an imprint lithography technique as follows. As shown in FIG. 9(a), an imprint resist 41 is applied onto a substrate 40. As shown in FIG. 9(b), the stamper 20 is positioned to face the resist 41 on the substrate 40, and stress is applied to press the stamper 20 against the resist 41, to transfer the convex-portion pattern of the substrate of the stamper 20 to the surface of the resist 41. After that, the stamper 20 is removed. As a result, the resist 41 turns into a resist pattern 41a having a concave-convex pattern formed therein (see FIG. 9(b)).

With the resist pattern 41a being used as a mask, etching is performed on the substrate 40, to obtain a substrate 40a having a concave-convex pattern formed therein. After that, the resist pattern 41a is removed (see FIG. 9(c)).

As shown in FIG. 9(d), a magnetic film 43 made of a material suited for vertical recording is formed on the substrate 40a. At this point, the portions of the magnetic film 43 formed on the convex portions of the substrate 40a turn into convex magnetic portions 43a, and the portions of the magnetic film 43 formed on the concave portions of the substrate 40a turn into concave magnetic portions 43b. It should be noted that a film stack formed with a soft magnetic underlayer and a ferromagnetic recording layer is formed as the magnetic film 43. Further, a protection film 45 made of carbon is formed on the magnetic film 43, and a lubricant is applied, so as to complete the magnetic recording medium.

As described above, rounding of the "shoulders" of the fine concave-convex pattern obtained by the concave-convex pattern forming method of this embodiment is restrained, and therefore, the concave-convex pattern is suitable as the matrix for an imprint stamper.

Second Embodiment

Referring now to FIGS. 10(a) through 10(d), a concave-convex pattern forming method according to a second embodiment is described. The concave-convex pattern forming method of the second embodiment is a method of forming a pattern having less rounding of the "shoulders" by forming films preferentially at the side portions of a guide pattern remaining as a mask.

Figure 10:
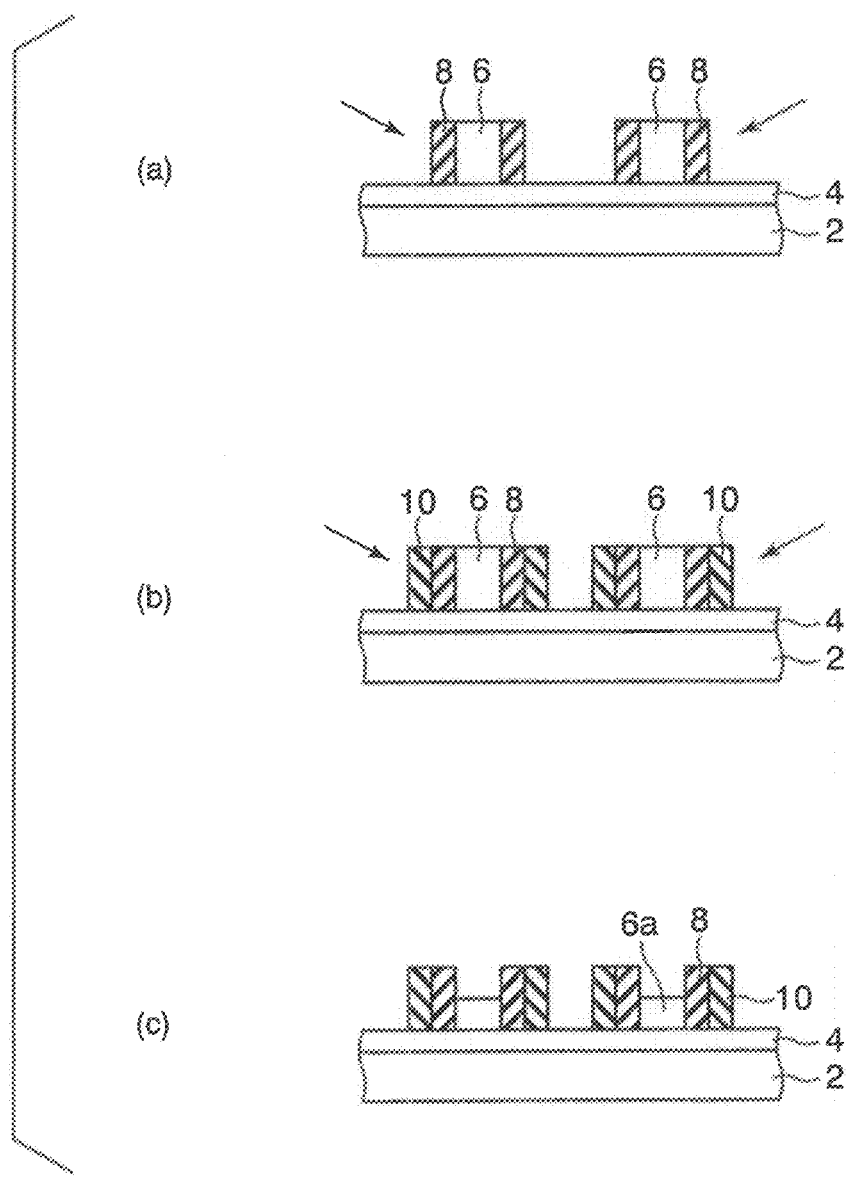
FIGS. 10(a) through 10(c) are cross-sectional views showing procedures to be carried out by a concave-convex pattern forming method according to a second embodiment.

First, as in the first embodiment, a base material in which a foundation layer 4 made of amorphous silicon, for example, is formed on a silicon substrate 2 is prepared, and a guide pattern 6 that has convex portions and concave portions arranged in a pattern and is made of carbon, for example, is formed on the foundation layer 4. By using a highly-directional film forming method such as an ion-beam film forming method, for example, a silicon oxide layer is formed as the lower layer 8 of the formation layer for forming a concave-convex pattern, while the base material is made to rotate at an incident angle of 45 degrees or smaller with respect to the base material (FIG. 10(a)). With this arrangement, the lower layer 8 is made thicker at the side portions of the guide pattern 6 than on the upper faces of the concave portions and the bottom faces of the groove portions of the guide pattern 6. After that, by using a highly-directional film forming method as well, an aluminum oxide layer is formed as the upper layer 10 of the formative layer for forming the concave-convex pattern, while the base material is made to rotate at an incident angle of 45 degrees or smaller with respect to the base material (FIG. 10(b)). By using RIE, etching is then preformed on the guide pattern 6, to form a mask for transferring the concave-convex pattern to the foundation layer 4. At this point, the portions of the upper layer 10 and the lower layer 8 existing on the upper portions of the guide pattern 6 and the bottom portions of the grooves of the guide pattern 6 are removed, with portions of the upper layer 10 and the lower layer 8 being left at the side portions of the guide pattern 6. It should be noted that the guide pattern 6 can not be completed removed, and can be partially left as shown in FIG. 10(c).

After that, by using the above described mask, the concave-convex pattern is transferred to the foundation layer 4 through the same procedures as those of the procedures of the first embodiment illustrated in FIG. 3(a) and the drawings following FIG. 3(a). In this manner, the concave-convex pattern is formed.

Like the formative layer of the first embodiment, the formative layer formed by the forming method of this embodiment has a double-layer structure formed with a silicon oxide layer and an aluminum oxide layer. As the amount of etching performed on the lower layer 8 and the upper layer 10 becomes smaller, rounding of the "shoulders" of the convex portions of the concave-convex pattern can be further restrained.

Third Embodiment

Figure 11:
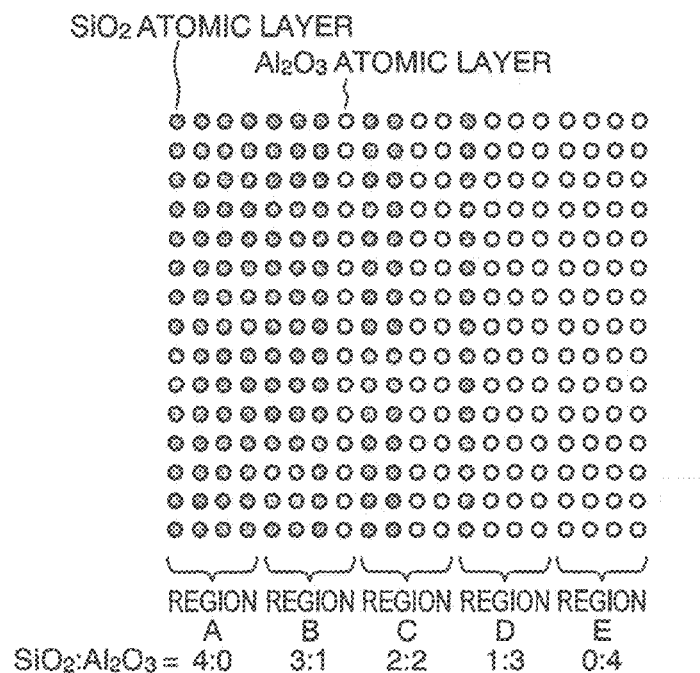
FIG. 11 is a diagram showing a layer distribution in the layer thickness direction of a formative layer formed by a forming method according to a third embodiment.
Figure 12:
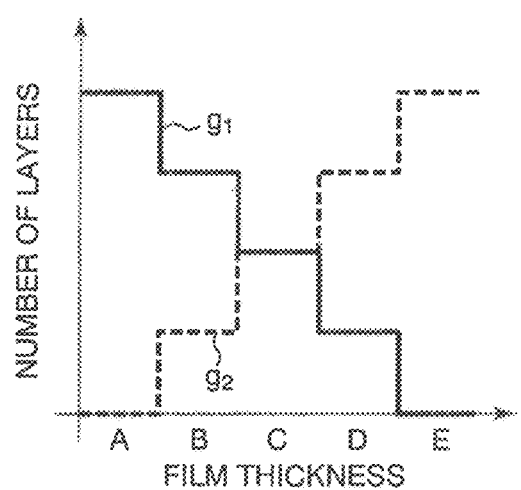
FIG. 12 is a graph showing the distributions of principal elements in the layer thickness direction of the formative layer formed by the forming method according to the third embodiment.

Referring now to FIGS. 11 and 12, a concave-convex pattern forming method according to a third embodiment is described. By the concave-convex pattern forming method of the third embodiment, the principal elements of the formative layer vary stepwise in the layer thickness direction.

By the concave-convex pattern forming method of this embodiment, the same procedures as those of the first embodiment are carried out until the formation of the guide pattern 6. This embodiment differs from the first embodiment in the method of forming the formative layer for forming a concave-convex pattern. In this embodiment, as the formative layer for forming a concave-convex pattern, silicon oxide layers and aluminum oxide layers are alternately formed on the atomic layer level by using ALD. For example, the number of atomic layers of silicon oxide layers becomes smaller as the guide pattern 6 becomes further away, and the number of atomic layers of aluminum oxide layers becomes larger as the guide pattern 6 becomes closer. That is, as shown in FIG. 11, regions in which silicon oxide layers and aluminum oxide layers are alternately formed on the guide pattern 6. Specifically, a region A, a region B, a region C, a region D, and a region E are formed in this order. In the region A, which is the closest to the guide pattern 6, the atomic layer number ratio between silicon oxide layers and aluminum oxide layers is 4:0. The ratio is 3:1 in the region B, 2:2 in the region C, 1:3 in the region D, and 0:4 in the region E.

FIG. 12 shows the relationship between the numbers of atomic layers of silicon oxide layers and aluminum oxide layers and the layer thickness direction in the above described situation. As can be seen from FIG. 12, at least the principal elements of the etching-resistant materials, or silicon and aluminum, vary stepwise in the layer thickness direction of the formative layer. The silicon decreases stepwise as the guide pattern 6 becomes further away, and the aluminum increases stepwise as the guide pattern 6 becomes further away.

As described above, in the formative layer formed by using the forming method of this embodiment, silicon oxide layers and aluminum oxide layers are alternately formed on the atomic layer level. The number of atomic layers of silicon oxide layers becomes smaller as the guide pattern 6 becomes further away, and the number of atomic layers of aluminum oxide layers becomes larger as the guide pattern 6 becomes further away. Accordingly, rounding of the "shoulders" of the convex portions of the concave-convex pattern, and warpage of the concave-convex pattern can be minimized.

It should be noted that the principal elements can continuously vary in the layer thickness direction of the formative layer. For example, by varying the CVD raw material gas species or varying the film forming temperature at the time of film formation, a layer in which the principal elements continuously vary can be formed.

Fourth Embodiment

Referring now to FIGS. 13(a) through 16, a concave-convex pattern forming method according to a fourth embodiment is described. By the concave-convex pattern forming method of the fourth embodiment, receding of the formative layer at the time of removal of the guide pattern is prevented.

Figure 13:
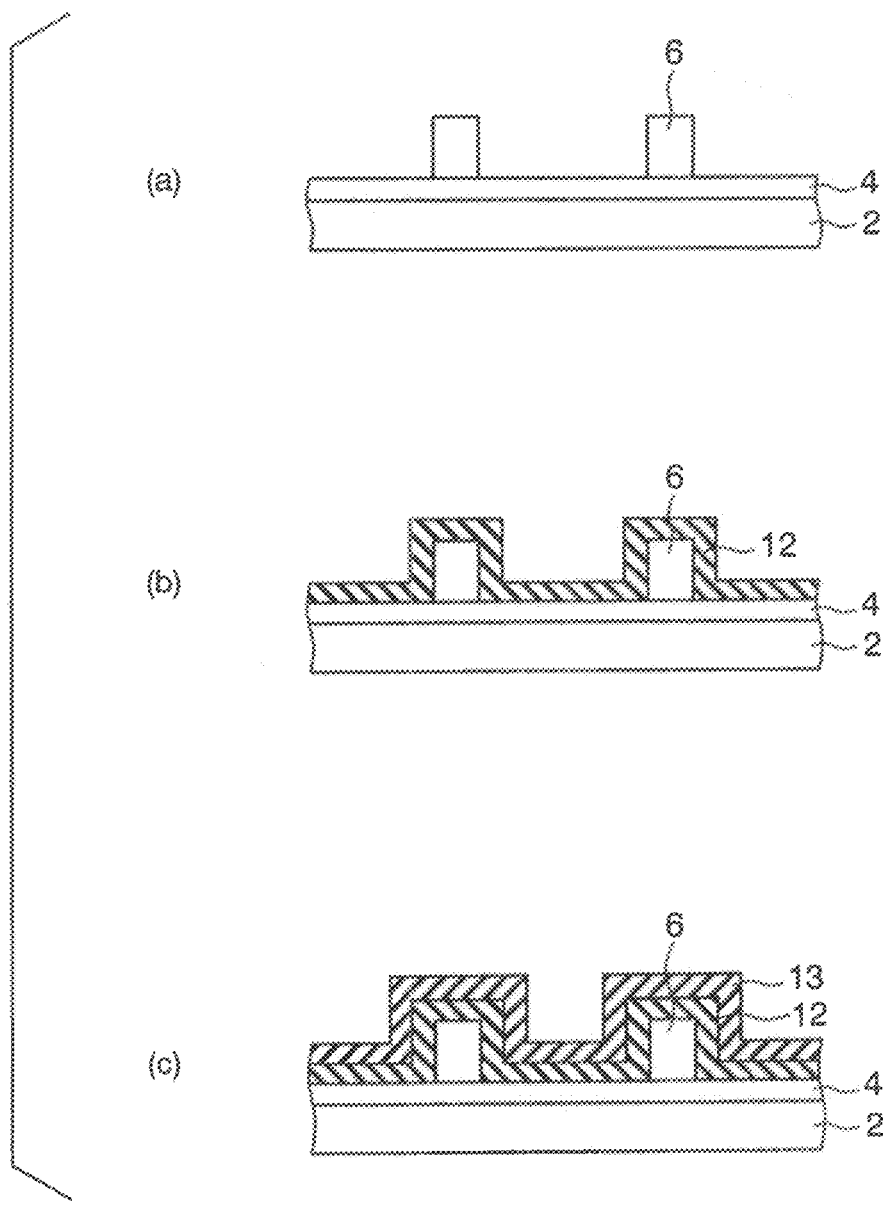
FIGS. 13(a) through 13(c) are cross-sectional views showing procedures to be carried out by a concave-convex pattern forming method according to a fourth embodiment.

By the concave-convex forming method of this embodiment, the same procedures as those of the first embodiment are carried out until the guide pattern 6 is formed (FIG. 13(*a*)). In the first embodiment, the guide pattern (the core material) 6 is formed by forming a carbon layer on the foundation layer 4 by CVD or sputtering, performing patterning on the carbon layer with the use of a resist pattern by a lithography technique, and slimming the line width by oxygen etching. After the resist pattern is slimmed by a lithography technique, patterning can be performed on the carbon layer. This guide pattern is 5 nm in line width, 20 nm in pitch, and 10 nm in height, for example.

Film formation is performed by a technique such as ALD, CVD, or sputtering. In this embodiment, a 1-nm thick aluminum oxide layer is formed as a lower layer 12 by ALD. Other than aluminum oxide, an oxide such as titanium oxide, tantalum oxide, tin oxide, chromium oxide, zirconium oxide, yttrium oxide, niobium oxide, indium oxide, lanthanum oxide, hafnium oxide, zinc oxide, or vanadium oxide can be used as the lower layer 12. Any of those materials can be formed into a film by ALD, without oxygen plasma. Alternatively, a nitride such as aluminum nitride, tantalum nitride, niobium nitride, titanium nitride, molybdenum nitride, zirconium nitride, hafnium nitride, gallium nitride, or silicon nitride can be used as the lower layer 12. A layer of any of those nitrides can be formed by ALD. Other than those layers, a layer containing a metal element as the principal element, such as platinum, ruthenium, iridium, palladium, copper, cobalt, or nickel, or a mixture of those materials can be used. A layer made of any of those metals can be formed by ALD. As shown in FIG. 13(*c*), an intermediate layer 13 to cover the lower layer 12 is then formed by a technique such as ALD, CVD, or sputtering. In this embodiment, a 3-nm thick silicon oxide layer is formed as the intermediate layer 13 by ALD.

Figure 14:
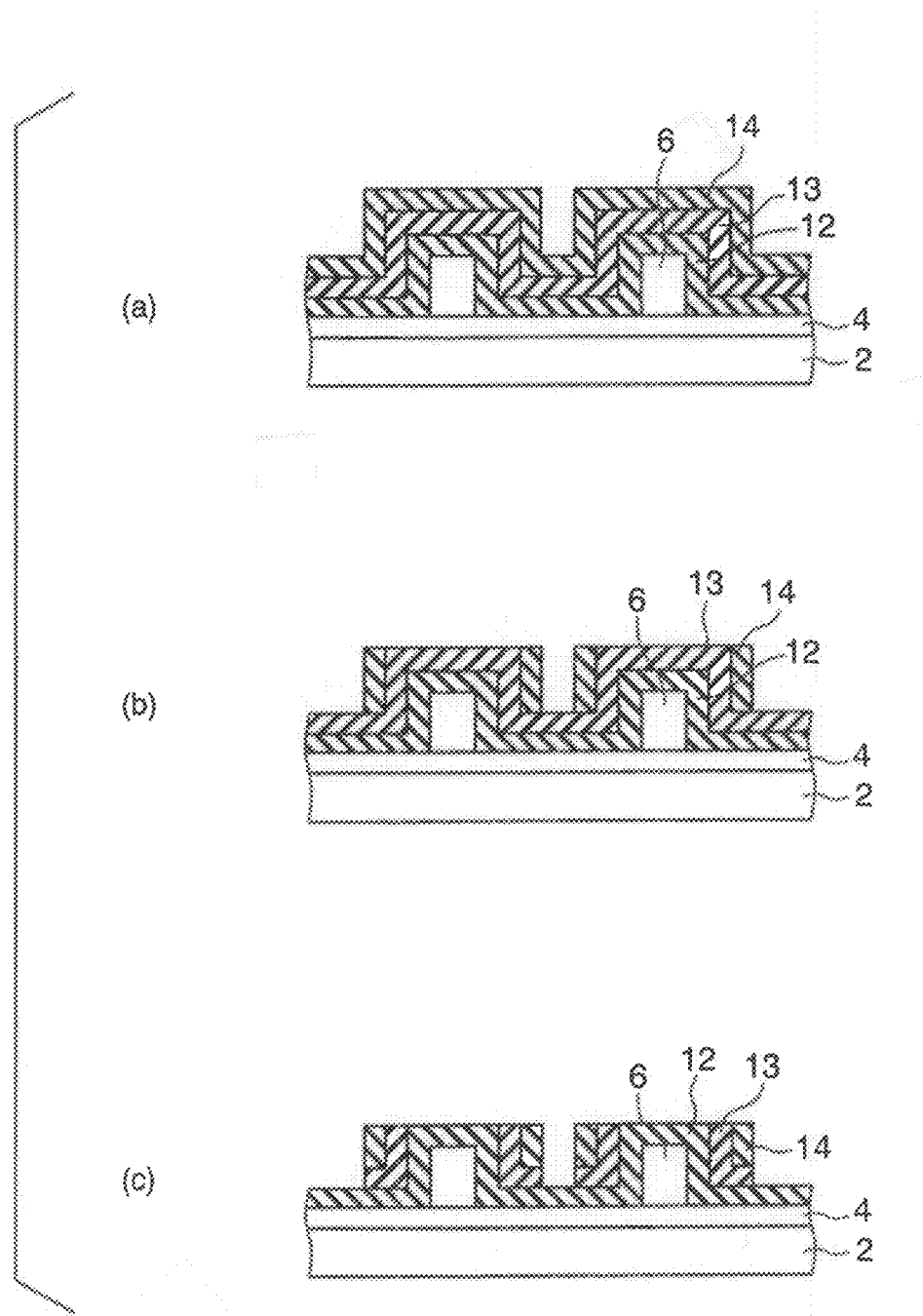
FIGS. 14(a) through 14(c) are cross-sectional views showing procedures to be carried out by a concave-convex pattern forming method according to the fourth embodiment.

As shown in FIG. 14(*a*), an upper layer 14 is formed by a technique such as ALD, CVD, or sputtering. In this embodiment, a 1-nm thick aluminum oxide layer is formed as the upper layer 14 by ALD. Other than aluminum oxide, an oxide such as titanium oxide, tantalum oxide, tin oxide, chromium oxide, zirconium oxide, yttrium oxide, niobium oxide, indium oxide, lanthanum oxide, hafnium oxide, zinc oxide, or vanadium oxide can be used as the upper layer 14. Any of those materials can be formed into a film by ALD, without oxygen plasma. Alternatively, a nitride such as aluminum nitride, tantalum nitride, niobium nitride, titanium nitride, molybdenum nitride, zirconium nitride, hafnium nitride, gallium nitride, or silicon nitride can be used as the upper layer 14. A layer of any of those nitrides can be formed by ALD. In this embodiment, the lower layer 12 is made of aluminum oxide, the intermediate layer 13 is made of silicon oxide, and the upper layer 14 is made of aluminum oxide. In another example using other materials, the lower layer 12 is made of tantalum nitride, the intermediate layer 13 is made of silicon oxide, and the upper layer 14 is made of aluminum oxide. In yet another example using other materials, the lower layer 12 is made of titanium nitride, the intermediate layer 13 is made of silicon oxide, and the upper layer 14 is made of aluminum oxide.

As shown in FIG. 14(*b*), trimming is performed on the upper layer 14 made of aluminum oxide by etching. That is, the portions of the aluminum oxide layer 14 existing above the upper faces of the guide pattern 6 are selectively removed, to expose the portions of the silicon oxide layer 13 existing above the upper faces of the guide pattern 6, and leave the aluminum oxide layer 14 only near the side portions of the guide pattern 6. The trimming is performed by argon ion milling, for example, so that the portions of the aluminum oxide layer 14 existing above the upper faces of the guide pattern 6 are selectively removed, and the portions of the silicon oxide layer 13 existing above the upper faces of the guide pattern 6 are exposed. Alternatively, the trimming is performed by RIE or the like using a carbon fluoride gas or a hydrogenated carbon fluoride gas.

Figure 15:
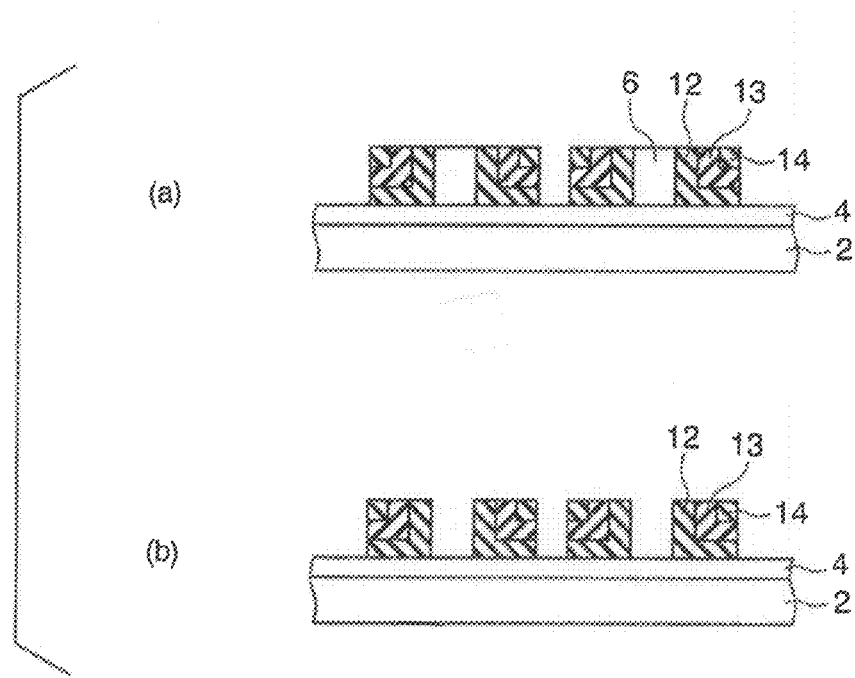
FIGS. 15(a) through 15(b) are cross-sectional views showing procedures to be carried out by a concave-convex pattern forming method according to the fourth embodiment.

As shown in FIG. 15(*a*), trimming is performed on the lower layer 12 made of aluminum oxide by etching. The portions of the aluminum oxide layer 12 existing on the upper faces of the guide pattern 6 are selectively removed, and the aluminum oxide layer 12 is left only at the side portions of the guide pattern 6. The etching is performed by RIE or the like using a mixed gas formed by adding argon or oxygen, as needed, to a carbon fluoride gas or a hydrogenated carbon fluoride gas as the principal gas.

As shown in FIG. 15(*b*), the guide pattern 6 made of carbon is removed by etching or ashing using oxygen plasma, to leave the concave-convex pattern formative layer consisting of the lower layer 12, the intermediate layer 13, and the upper layer 14.

In this manner, the concave-convex pattern formative layer (mask) consisting of the lower layer 12, the intermediate layer 13, and the upper layer 14 is formed in this embodiment. As the mask, the concave-convex pattern formative layer is 5 nm in line width, 10 nm in pitch, and 10 nm in height, for example. Compared with the guide pattern 6, which is 5 nm in line width, 20 nm in pitch, and 10 nm in height, this concave-convex pattern formative layer has a half the pitch of the guide pattern 6. In this manner, a concave-convex pattern formative layer with narrower pitch than that of the guide pattern 6 can be obtained.

Further, the aluminum oxide layer 14 in which chemical etching hardly progresses is formed as the upper layer 14 outside the intermediate layer 13. Accordingly, when trimming is lastly performed on the lower layer 12 by etching, side etching hardly progresses in the sidewalls of the lower layer 12. As a result, a concave-convex pattern formative layer (mask) without rounding of the "shoulders" can be formed.

Further, an aluminum oxide layer having an endurance to oxygen plasma is formed as the lower layer 12 on the guide pattern 6, so that the guide pattern 6 is protected by oxygen plasma. With this arrangement, receding of the guide pattern 6 due to oxygen plasma is prevented during the process to form the formative layer. Accordingly, the intermediate layer 13 can be formed with the use of oxygen plasma. As the process margin becomes larger, the production costs become lower.

Figure 16:
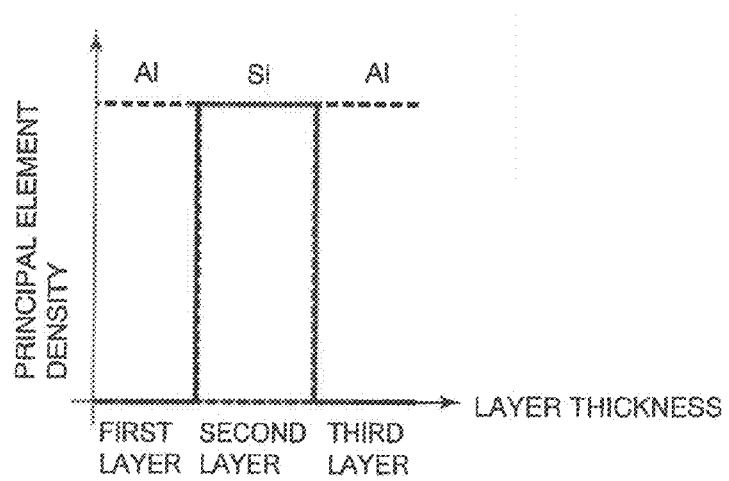
FIG. 16 is a graph showing the distributions of principal elements in the layer thickness direction of a formative layer formed by a forming method according to the fourth embodiment.
Figure 17:
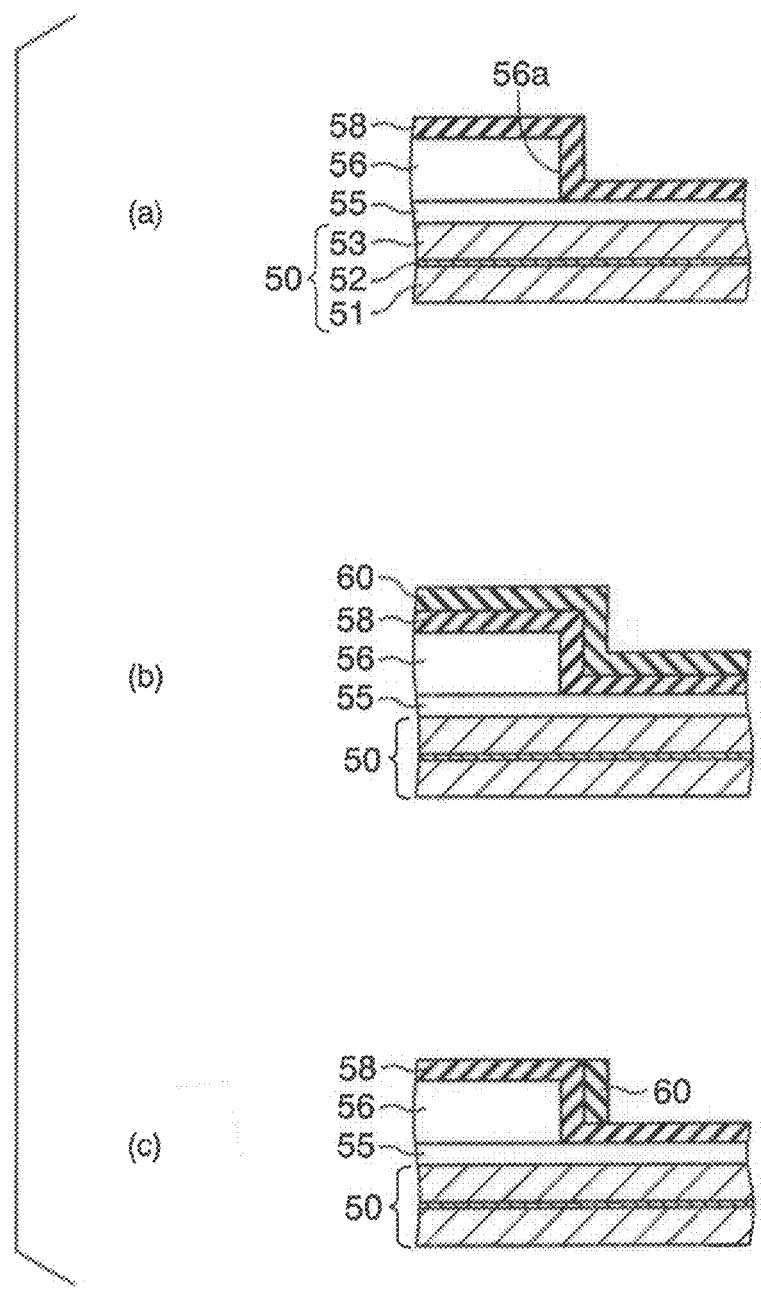
FIGS. 17(a) through 17(c) are cross-sectional views showing procedures to be carried out by a concave-convex pattern forming method according to a fifth embodiment.
Figure 18:
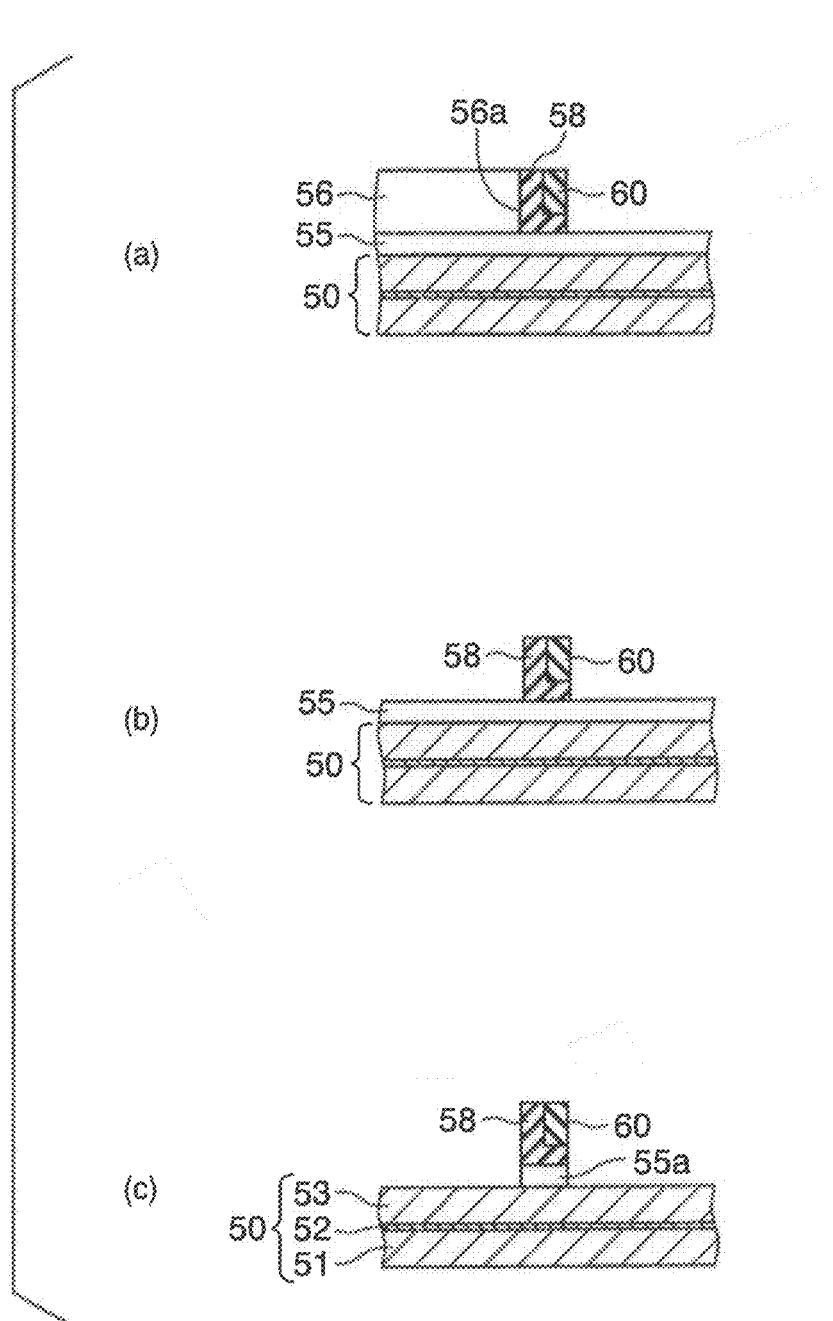
FIGS. 18(a) through 18(c) are cross-sectional views showing procedures to be carried out by a concave-convex pattern forming method according to the fifth embodiment.
Figure 19:
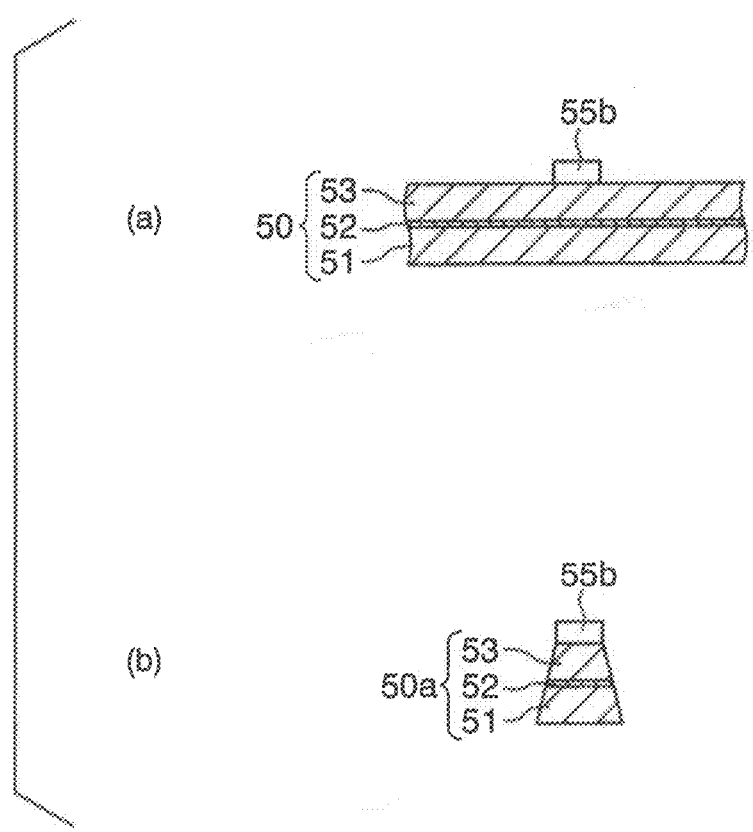
FIGS. 19(a) through 19(b) are cross-sectional views showing procedures to be carried out by a concave-convex pattern forming method according to the fifth embodiment.

FIG. 16 shows the density distributions of the principal elements of the concave-convex formative layer (mask) formed as above. The principal element of the lower layer 12 is aluminum, the principal element of the intermediate layer 13 is silicon, and the principal element of the upper layer 14 is aluminum.

Thereafter, with the concave-convex pattern formative layer being used as a mask, patterning is performed on the foundation layer 4, to form a concave-convex pattern, as in the first embodiment. With the use of the concave-convex pattern, an imprint stamper can be formed as in the first embodiment.

Although the metal element contained in the lower layer 12 is the same as the metal element contained in the upper layer 14 in this embodiment, the metal element contained in the lower layer 12 can be different from the metal element contained in the upper layer 14. In that case, the intermediate layer 13 can contain a metal element, instead of silicon, but the metal element contained in the intermediate layer 13 is preferably different from the metal elements contained in the lower layer 12 and the upper layer 14.

Fifth Embodiment

Referring now to FIGS. 17(a) through 19(b), a concave-convex pattern forming method according to a fifth embodiment is described. The concave-convex pattern forming method of this embodiment is used to form a Magnetic Tunnel Junction (MTJ).

First, as shown in FIG. 17(a), a MTJ film 40 including a first ferromagnetic layer 51, a tunnel barrier layer 52 formed on the first ferromagnetic layer 51, and a second ferromagnetic layer 53 formed on the tunnel barrier layer 52 is prepared. A 50-nm thick hard mask layer 55 made of tantalum is then formed on the second ferromagnetic layer 53 of the MTJ film 50. After that, a guide pattern (a core material) 56 made of carbon is formed on the hard mask layer 55. The guide pattern 56 is formed by the method described in the first through fourth embodiments. The guide pattern 56 has a 60-nm step portion that includes an end face 56a substantially perpendicular to the upper face of the hard mask layer 55. The step portion is formed by etching with oxygen. Therefore, the guide pattern 56 covers part of the hard mask layer 55, but the other portions of the hard mask layer 55 are exposed. A lower layer 58 is formed to cover the guide pattern 56 and the exposed portions of the hard mask layer 55. The lower layer 58 is designed to cover the end face 56a of the guide pattern 56. The lower layer 58 is made of silicon oxide, for example, has a layer thickness of 14.4 nm, for example, and is formed by a technique such as ALD, CVD, or sputtering.

As shown in FIG. 17(b), an upper layer 60 is then formed by a technique such as ALD, CVD, or sputtering. At this point, a 2-nm thick aluminum oxide layer is formed as the upper layer 60 by ALD, for example.

As shown in FIG. 17(c), trimming is then performed on the aluminum oxide layer 60 as the upper layer by etching. That is, the portions of the aluminum oxide layer 60 existing above the upper face of the guide pattern 56 and the upper face of the hard mask layer 55 are removed to expose the silicon oxide layer 58, and the aluminum oxide layer 60 is left only along the end face 56a of the guide pattern 56. Argon ion milling is performed as the trimming, to selectively remove the aluminum oxide layer 60 and selectively expose the silicon oxide layer 58. Alternatively, the trimming is performed by RIE using a carbon fluoride gas or a hydrogenated carbon fluoride gas.

As shown in FIG. 18(a), trimming is performed on the silicon oxide layer 58 as the lower layer by etching. That is, the portions of the silicon oxide layer 58 existing on the upper face of the guide pattern 56 and the upper face of the hard mask layer 55 are removed, and the silicon oxide layer 58 is left only along the end face 56a of the guide pattern 56. As the trimming, RIE using a carbon fluoride gas or a hydrogenated carbon fluoride gas is performed.

As shown in FIG. 18(b), the guide pattern 56 made of carbon is removed by etching or ashing with oxygen plasma. As a result, a concave-convex pattern formative layer (mask) formed with the lower layer 58 and the upper layer 60 is formed. At this point, the mask is 15 nm in width and 60 nm in height, for example.

Further, the aluminum oxide layer 60 in which chemical etching hardly progresses is formed as the upper layer 60 outside the lower layer 58 made of silicon oxide. Accordingly, when trimming is lastly performed on the lower layer 58 by etching, side etching hardly progresses in the lower layer 58. As a result, a concave-convex pattern formative layer (mask) without rounding of the "shoulders" can be formed.

As shown in FIG. 18(c), the concave-convex pattern formative layer formed with the lower layer 58 and the upper layer 60 is used as a mask, and patterning is formed on the hard mask layer 55, to form a linear hard mask 55a from the hard mask material. The concave-convex pattern formative layer formed with the lower layer 58 and the upper layer 60 is then covered with an insulating film (not shown), and flattening is performed by Chemical Mechanical Polishing (CMP), to expose the upper face of the concave-convex pattern formative layer. By using the same process as that described above, a mask (not shown) against etching is formed in a direction substantially perpendicular to the linear hard mask 55a. With the use of this mask, etching is preformed on the concave-convex pattern formative layer serving as the base and the hard mask 55a, to form a rectangular hard mask 55b (FIG. 19(a)). With the use of the hard mask 55b, patterning is performed on the MTJ film 50, to form a MTJ 50a (FIG. 19(b)). The processing of the MTJ 50a is performed by physical etching such as ion milling, to form desired shapes.

Like the first embodiment, this embodiment can also minimize rounding of the "shoulders" of the convex portions of a concave-convex pattern and warpage of the concave-convex pattern.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A method of forming a concave-convex pattern, comprising:
    forming a guide pattern on a base material, the guide pattern having a convex portion;
    forming a formative layer on the guide pattern, the formative layer including a plurality of sets of stacked structures, each of the stacked structures including a first layer and a second layer, the respective sets being configured so that a number of atomic layers in the first layers decreases as the guide pattern becomes further away, and a number of atomic layer in the second layers increases as the guide pattern becomes further away, the first layer including at least one element selected from a first metal element and a metalloid element, the second layer including a second metal element different from the first metal element;
    selectively leaving the formative layer only at side faces of the convex portions by performing etching on the formative layer;
    removing the guide pattern; and
    forming the concave-convex pattern in the base material by performing etching on the base material, with the remaining formative layer being used as a mask.

2. The method according to claim 1, wherein the first layer is a silicon oxide layer, and the second layer is an aluminum oxide layer.

3. The method according to claim 1, wherein the formative layer is formed by Atomic Layer Deposition.

4. The method according to claim 1, wherein the first and second layers are formed with materials having different film stresses from each other.

5. The method according to claim 1, wherein the first layer is formed with a material having one of a compressive stress and a tensile stress, and the second layer is formed with a material having the other of the compressive stress and the tensile stress.

6. The method according to claim 1, wherein the selectively leaving the formative layer only at the side faces of the convex portion is performed by etching in which an etching rate of the second layer is smaller than that of the first layer.

7. A method of forming a magnetic tunnel junction element, comprising:
   forming a magnetic tunnel junction film including first and second magnetic layers and a tunnel barrier layer between the first and second magnetic layers;
   forming a hard mask on the magnetic tunnel junction film;
   forming the concave-convex pattern in the hard mask by using the method according to claim 1;
   patterning the magnetic tunnel film by performing etching with the concave-convex pattern being used as a mask.

\* \* \* \* \*